United States Patent
Sasajima et al.

(10) Patent No.: US 11,899,437 B2
(45) Date of Patent: Feb. 13, 2024

(54) DIAGNOSTIC SYSTEM

(71) Applicant: Hitachi High-Tech Corporation, Tokyo (JP)

(72) Inventors: Fumihiro Sasajima, Tokyo (JP); Masami Takano, Tokyo (JP); Kazuhiro Ueda, Tokyo (JP); Masayoshi Ishikawa, Tokyo (JP); Yasuhiro Yoshida, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 0 days.

(21) Appl. No.: 17/907,921

(22) PCT Filed: Mar. 30, 2020

(86) PCT No.: PCT/JP2020/014580
§ 371 (c)(1),
(2) Date: Aug. 29, 2022

(87) PCT Pub. No.: WO2021/199164
PCT Pub. Date: Oct. 7, 2021

(65) Prior Publication Data
US 2023/0095532 A1    Mar. 30, 2023

(51) Int. Cl.
*G05B 23/02* (2006.01)
(52) U.S. Cl.
CPC ....... *G05B 23/024* (2013.01); *G05B 23/0264* (2013.01)

(58) Field of Classification Search
CPC .............. G05B 23/024; G05B 23/0264; G05B 23/0281
See application file for complete search history.

(56) References Cited

U.S. PATENT DOCUMENTS

| 2006/0247818 A1 | 11/2006 | Hasan |
| 2006/0284081 A1* | 12/2006 | Miyamoto ............ H01J 37/153 250/307 |
| 2011/0147587 A1 | 6/2011 | Yang et al. |

(Continued)

FOREIGN PATENT DOCUMENTS

| CN | 110888412 A | 3/2020 |
| JP | H1116967 A * | 1/1999 ............. H01L 21/66 |

(Continued)

OTHER PUBLICATIONS

Machine Translation of JP2020042398A (Year: 2020).*
(Continued)

*Primary Examiner* — Mischita L Henson
(74) *Attorney, Agent, or Firm* — Crowell & Moring LLP

(57) ABSTRACT

The present disclosure proposes a diagnostic system capable of properly identifying the cause of even an error for which multiple factors or multiple compound factors may be accountable. The diagnostic system according to the present disclosure is provided with a learning device for learning at least one of a recipe defining operations of an inspection device, log data describing states of the device, or specimen data describing characteristics of a specimen in association with error types of the device, and estimates the cause of the error by using the learning device (refer to FIG. 4).

16 Claims, 24 Drawing Sheets

(56) References Cited

U.S. PATENT DOCUMENTS

| | | | |
|---|---|---|---|
| 2011/0188735 A1* | 8/2011 | Hosoya | G06T 7/001 382/149 |
| 2014/0067324 A1 | 3/2014 | Ho et al. | |
| 2018/0164792 A1 | 6/2018 | Lin et al. | |
| 2020/0074611 A1* | 3/2020 | Dou | G06T 7/74 |
| 2020/0081757 A1 | 3/2020 | Ota et al. | |
| 2022/0334172 A1* | 10/2022 | Hayakawa | G01R 31/2846 |

FOREIGN PATENT DOCUMENTS

| | | | | |
|---|---|---|---|---|
| JP | 2001165876 A | * | 6/2001 | G01N 23/225 |
| JP | 2010-87070 A | | 4/2010 | |
| JP | 2010-92632 A | | 4/2010 | |
| JP | 2020-42398 A | | 3/2020 | |
| TW | 201411763 A | | 3/2014 | |
| TW | 201908896 A | | 3/2019 | |
| TW | 201941328 A | | 10/2019 | |
| TW | 201947433 A | | 12/2019 | |
| WO | WO 2009/114382 A1 | | 9/2009 | |
| WO | WO-2018140105 A1 | * | 8/2018 | G06F 16/2379 |
| WO | WO 2019/013828 A1 | | 1/2019 | |

OTHER PUBLICATIONS

Machine Translation of JP2010087070A (Year: 2010).*
Machine Translation of JPH1116967A (Year: 1999).*
Machine Translation of JP2001165876A (Year: 2001).*
International Search Report (PCT/ISA/210) issued in PCT Application No. PCT/JP2020/014580 dated Jun. 16, 2020 with English translation (six (6) pages).
Japanese-language Written Opinion (PCT/ISA/237) issued in PCT Application No. PCT/JP2020/014580 dated Jun. 16, 2020 (six (6) pages).

* cited by examiner

FIG. 8

```
                    Error Report
Error Description:
Error Device: SEM 1
Date: 01-27-2020
Time:19:40:13

Error Detail: ....error
Recipe information:      Error score:
Recipe name: xxxxxx      xxx
Condition A:xxx          xxx
          B:xxx          xxx
          C:xxx          xxx
            :              :
            :              :
Sample information:      Error score:
Sample name: xxx         xxx
Layer: xxx               xxx
Lot.No: xxx              xxx
Target pattern: xxx      xxx
CD value (a): xxx        xxx
Design (b): xxx          xxx
Ratio (a/b): xxx         xxx
Process condition:                      Actual value
condition A:             xxx            xxx
condition B:             xxx            xxx
condition C:             xxx            xxx
            :              :              :
            :              :              :
SEM information:         Error score:   Set value    Actual value
Condition A:xxx          xxx            xxx          yyy
          B:xxx          xxx            xxx          yyy
          C:xxx          xxx            xxx          yyy
            :              :              :            :
            :              :              :            :
```

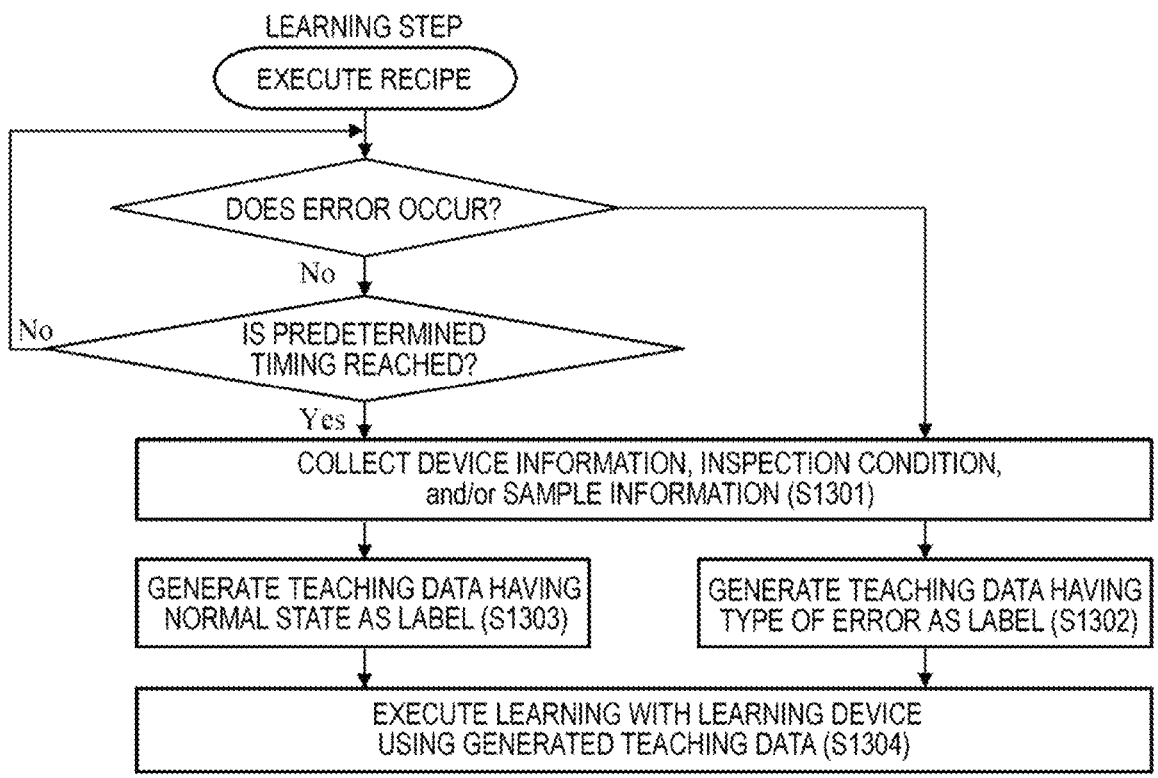

FIG. 18
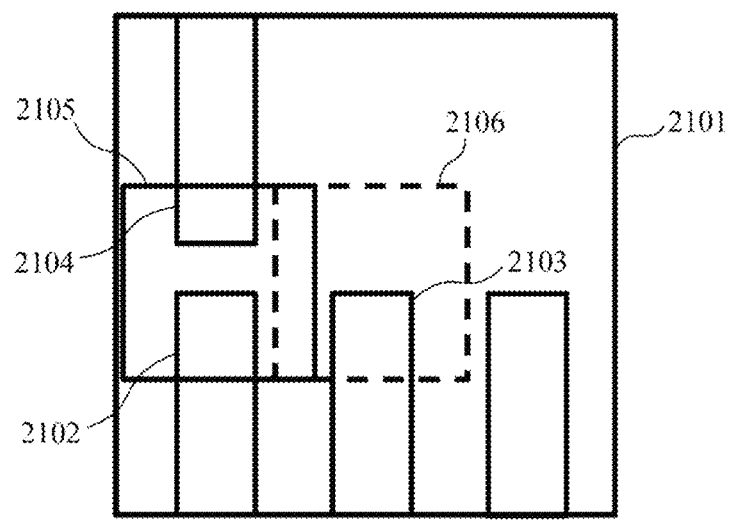
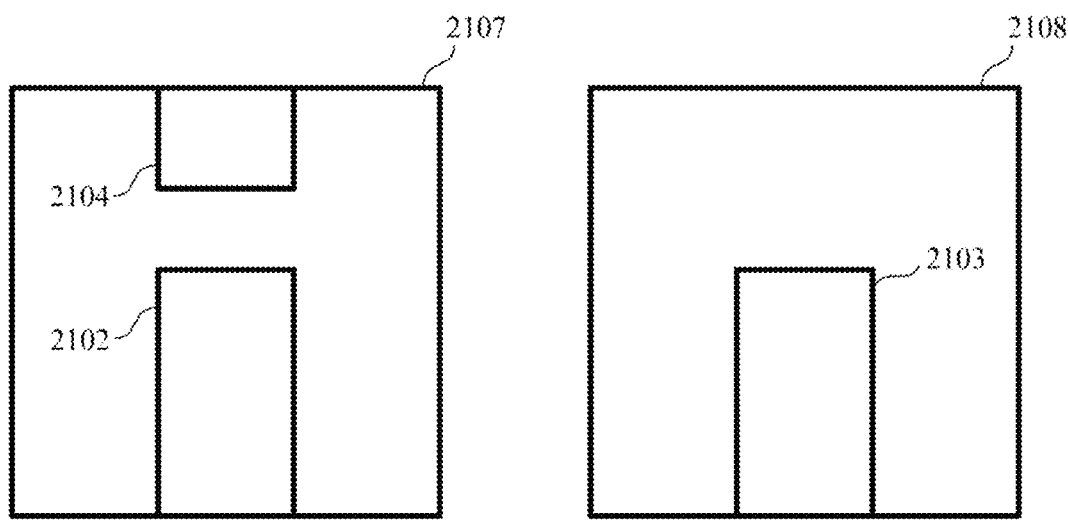
IMAGE FOR LENGTH MEASUREMENT ACQUIRED AT CORRECT FIELD-OF-VIEW POSITION
IMAGE FOR LENGTH MEASUREMENT ACQUIRED AT INCORRECT FIELD-OF-VIEW POSITION

FIG. 21

DIAGNOSTIC SYSTEM

TECHNICAL FIELD

The present disclosure relates to a diagnosis system that diagnoses a state of an inspection device for inspecting a sample.

BACKGROUND ART

A scanning electron microscope (SEM) used for measuring or inspecting a semiconductor device is controlled by a control program (hereinafter, also referred to as "recipe") where measurement or inspection conditions are set. For example, among scanning electron microscopes, a critical dimension-SEM (CD-SEM) measures a sample manufactured by mass production by fixed-point observation and is used for checking the performance of the sample.

JP-A-2010-87070 (PTL 1) discloses a technique in which, even when setting conditions of a recipe are not suitable for measurement of a sample depending on a variation in manufacturing conditions of the sample such that error occurs, an error occurrence cause is specified. PTL 1 discloses a recipe diagnosis device that displays a score for indicating the degree of agreement of pattern matching, a coordinate shift before and after the pattern matching, or a timely change in an amount of variation of a lens before and after auto focus of the lens.

CITATION LIST

Patent Literature

PTL 1: JP-A-2010-87070 (corresponding to US2011/0147567)

SUMMARY OF INVENTION

Technical Problem

Using the device of PTL 1, by evaluating the variation of the degree of agreement of pattern matching and the like and adjusting the recipe at an appropriate timing, a state where the operating rate of the CD-SEM or the like is high can be maintained. However, there may be various error occurrence causes. Therefore, simply when the transition of the degree of agreement of the pattern matching or the like is evaluated, the adjustment cannot be appropriately executed. In addition, as the causes for the occurrence of the error, not only the variation in the manufacturing conditions of a sample but also a change in an external environment or a change in device conditions such as a CD-SEM can be considered. In addition, there may be a case where initial recipe setting conditions are not suitable for the measurement.

The present disclosure has been made in consideration of the above-described problems and proposes a diagnosis system that, even when there may be a plurality of causes or a plurality of composite causes for the occurrence of an error, a cause for the error can be appropriately specified.

Solution to Problem

The diagnosis system according to the present disclosure includes a learning device configured to learn, at least one of a recipe that defines an operation of an inspection device, log data that describes the state of the device, or sample data that describes characteristics of the sample in association with a type of the error of the device, in which a cause of the error is estimated using the learning device.

Advantageous Effects of Invention

In the diagnosis system according to the present disclosure, even when a plurality of causes or a plurality of composite causes are estimated as an error cause of an inspection device, the cause can be appropriately specified.

BRIEF DESCRIPTION OF DRAWINGS

FIG. 8 is a diagram showing an example of a report that describes a result of estimating an error cause by the computer system 103.

FIG. 9 is a flowchart showing a step of causing a learning device to execute learning in response to an error that occurs when a recipe is executed as a trigger.

FIG. 18 is a diagram showing an example of abnormality determination executed in S2003.

FIG. 21 is a diagram showing one example of an analysis screen that analyzes a stage position accuracy in each of the devices.

DESCRIPTION OF EMBODIMENTS

First Embodiment

Hereinafter, a system that outputs a cause for an error generated by a measurement or inspection device (hereinafter, simply referred to as "inspection device") by inputting a device condition of the inspection device, an inspection condition of the inspection device, and the like will be described. In addition, the diagnosis system that detects a prediction for the occurrence of an error based on the input of the device condition and the like will be described.

Figure 1:
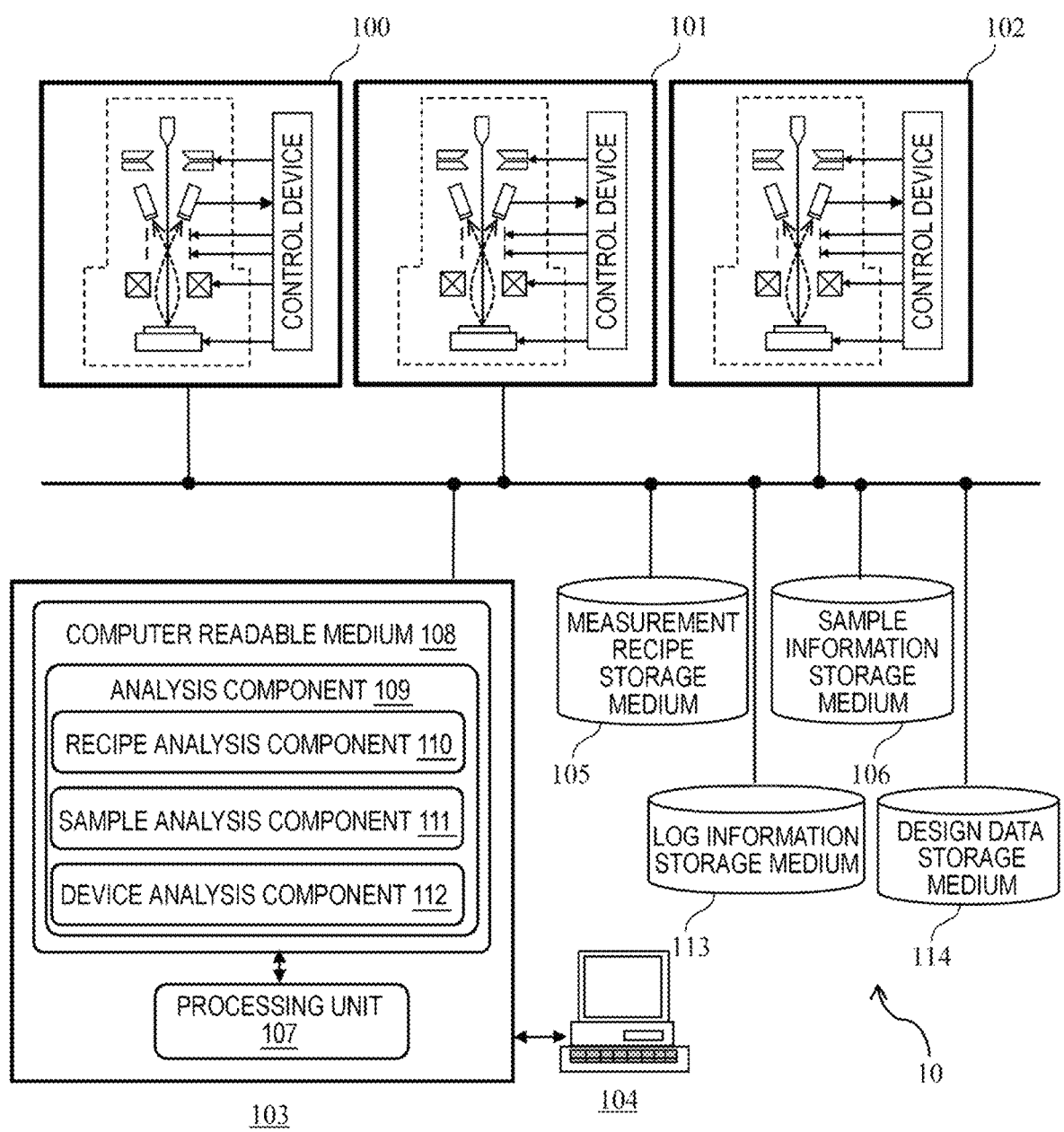
FIG. 1 is a diagram showing one example of a measurement system 10 including a plurality of image acquisition tools.

FIG. 1 is a diagram showing one example of a measurement system 10 including a plurality of image acquisition tools. The image acquisition tool is, for example, a SEM that forms an image by detecting electrons (for example, secondary electrons or backscattered electrons) obtained by scanning a pattern formed on a semiconductor wafer with an electron beam. In the first embodiment, as one example of the SEM, a CD-SEM that is one measurement device for measuring a dimension or a shape of a pattern based on a detection signal will be described. However, the present invention is not limited to this example, and the SEM may be a review SEM that inspects foreign matter or defects based on given coordinate information. In addition, for example, a focused ion beam device that generates an image based on ion beam scanning can also be an image generation tool.

The system of FIG. 1 includes three CD-SEMs 100, 101, and 102. Further, in the system shown in FIG. 1, a computer system 103 is connected to the CD-SEMs through a bus or a network. An input/output device 104 that inputs and outputs data to and from the computer system 103 is connected to the computer system 103. The computer system 103 can get access to a measurement recipe storage medium 105 that stores a recipe as one operation program of the CD-SEM, a log information storage medium 113 that stores a current device state of the CD-SEM, a sample information storage medium 106 that stores sample information as a measurement target of the CD-SEM, and a design data storage medium 114 that stores design data of a semiconductor device.

The computer system 103 is configured with one or more computer sub systems. The computer system 103 includes a computer readable medium 108 and a processing unit 107 that executes each of components (modules) stored in the computer readable medium 108. The computer readable medium 108 stores an analysis component 109 that analyzes information stored in a storage medium that is connected to be accessible to the computer system 103 described above. The analysis component 109 includes a recipe analysis component 110, a sample analysis component 111, and a device analysis component 112.

The measurement recipe storage medium 105 stores the number of measurement points, coordinate information of a measurement point (evaluation point: EP), an imaging condition when an image is acquired, an imaging sequence, and the like depending on the type of a sample (for example, a semiconductor wafer). In addition, not only the measurement points but also coordinates, imaging conditions, and the like of an image that is acquired at a preparation stage for measuring the measurement points are stored.

The image acquired at the preparation stage is, for example, a low magnification (wide field of view) image for specifying an accurate field-of-view position or an image for adjusting an optical condition of a beam at a position other than a measurement target pattern. The low magnification image is an image that is acquired to include a pattern (addressing pattern: AP) having a unique shape that has a known positional relationship with the measurement target pattern. The low magnification image is used for specifying an addressing pattern position by executing pattern matching using a template image that includes a pattern having the same shape as an AP on the low magnification image registered in advance, and is further used for specifying a measurement target pattern that has a known positional relationship with the addressing pattern. The image for adjusting the optical condition is an image for auto focus (AF) adjustment, auto astigmatism (AST), or auto brightness contrast control (ABCC).

The imaging condition when an image is acquired is, for example, an acceleration voltage of a beam, a field of view (FOV) size, a probe current, a lens condition, or the number of frames (cumulative number). The imaging conditions and the coordinates are set for each acquired image. The imaging sequence is, for example, a control procedure of the CD-SEM until the measurement.

The measurement recipe storage medium 105 stores various measurement conditions other than the above-described example. The computer system 103 can optionally read storage information.

The log information storage medium 113 stores the current device information in association with a recipe, sample information, a time when the device information is acquired, and the like. Specifically, position information (for example, a deviation from a predetermined position) of the addressing pattern in the low magnification image when a position is specified using the addressing pattern, a period of time required for AF, the number of images, a gain or a bias of a detector output during execution of ABCC, dimension information of a pattern, a peak height, and the like are stored. In addition, for example, outputs of various sensors and the like provided in the CD-SEM and control signals such as a voltage value, a current value, or a DAC value supplied to an electrode, a coil, a detector, and the like may also be stored.

The sample information storage medium 106 stores, for example, manufacturing conditions of a semiconductor wafer as a measurement target. For example, when the measurement target is a resist pattern, the manufacturing conditions are a type of an exposure device used for patterning the resist pattern, exposure conditions (for example, a dose or a focus value), a type of a resist material, a thickness, a dimension value, and the like.

The design data storage medium 114 stores layout data of a semiconductor pattern.

For example, the computer system 103 specifies an error cause occurred in the CD-SEM, estimates a reliability of a generated measurement recipe, and executes predictive diagnosis of an error based on an output of the CD-SEM and information stored in the storage medium. A specific process content will be described below.

Figure 2:
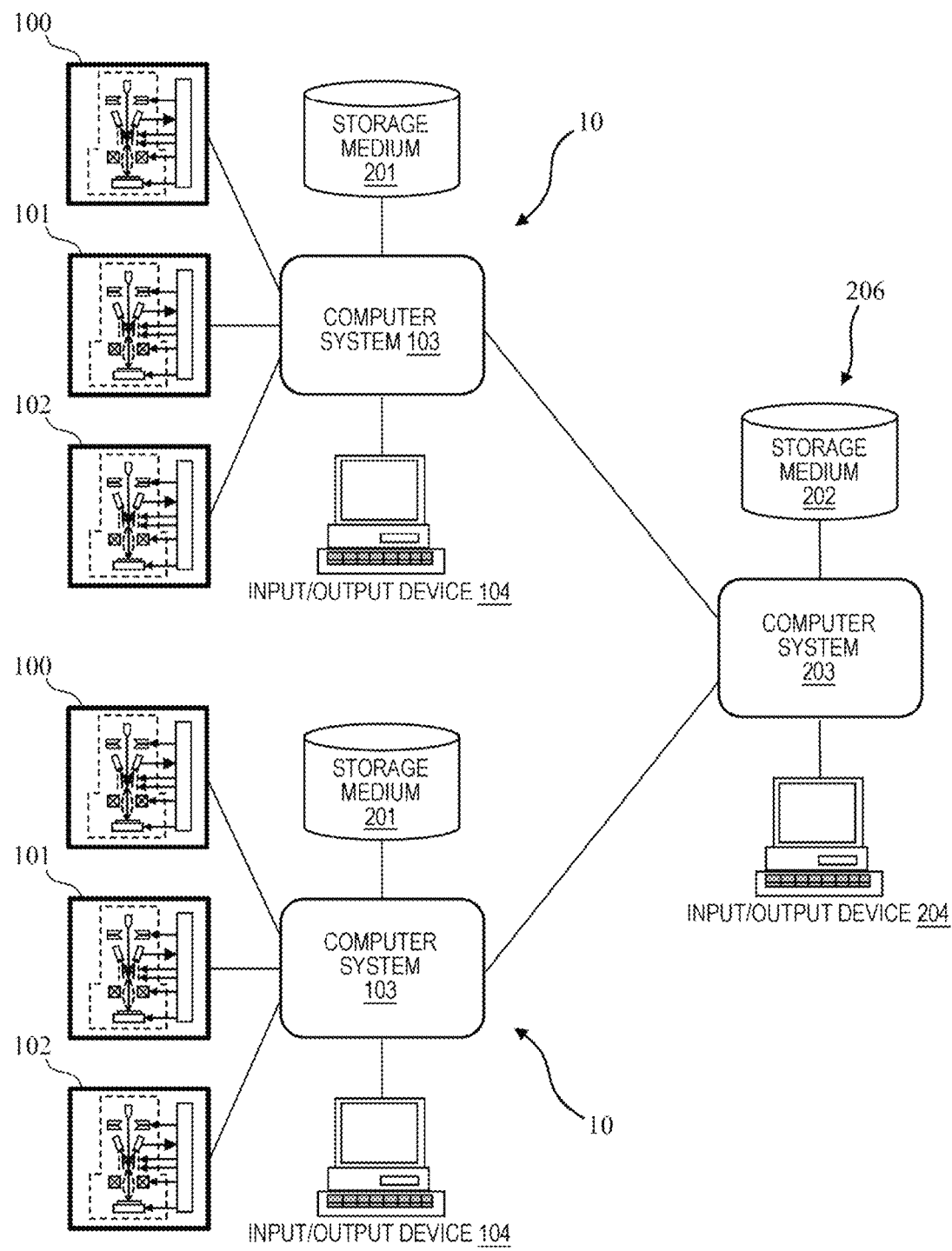
FIG. 2 is a diagram showing one example of a diagnosis system that manages the measurement system shown in FIG. 1.

FIG. 2 is a diagram showing one example of a diagnosis system that manages the measurement system shown in FIG. 1. For example, a diagnosis system 206 specifies an error cause, estimates a reliability of a generated measurement recipe, and executes predictive diagnosis of an error based on outputs of a plurality of measurement systems 10 including the plurality of CD-SEMs 100, 101, and 102, a storage medium 201 that stores various information as shown in FIG. 1, the input/output device 104, and the computer system (sub system) 103. A specific process content will be described below.

Figure 3:
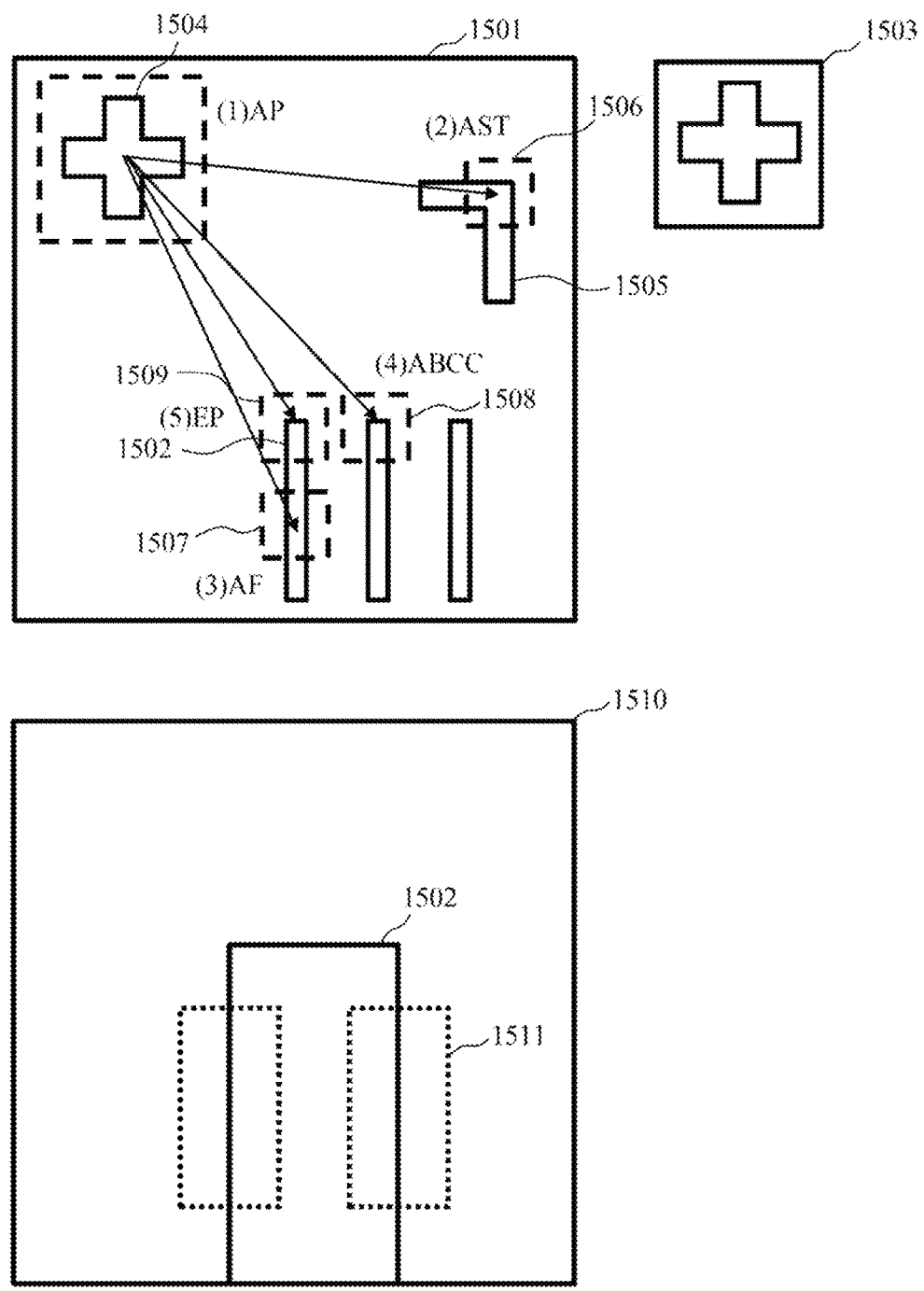
FIG. 3 is a diagram showing an example of a measurement target pattern formed on a sample.

FIG. 3 is a diagram showing an example of a measurement target pattern formed on a sample. As an imaging sequence, for example, when the width of an upper end of a measurement target pattern 1502 is measured, first, a low magnification image 1501 for addressing is acquired, and a position of an addressing pattern 1504 is specified by pattern matching using a template image 1503. When the position of the addressing pattern can be specified by setting the distance between the addressing pattern 1504 and the measurement target pattern 1502 to be in a range where a beam deflector provided in the CD-SEM can deflect a beam, a field of view 1506 for measurement can be irradiated with a beam only by beam deflection without accompanying stage movement.

When the imaging sequence is set, for example, a procedure for positioning the field of view 1506 at a predetermined position of a pattern 1505 for executing addressing or AST, positioning a field of view 1507 at a predetermined position for executing AF, positioning a field of view 1508 at a predetermined position for executing ABCC, and positioning a field of view 1509 at a position for executing measurement is determined, and conditions are set such that the CD-SEMs are controlled in the determined order. Further, the position, the size, and the like of a measurement cursor 1511 for determining a measurement reference on a high magnification image 1510 for measurement obtained by beam scanning on the field of view 1509 are determined.

Figure 4:
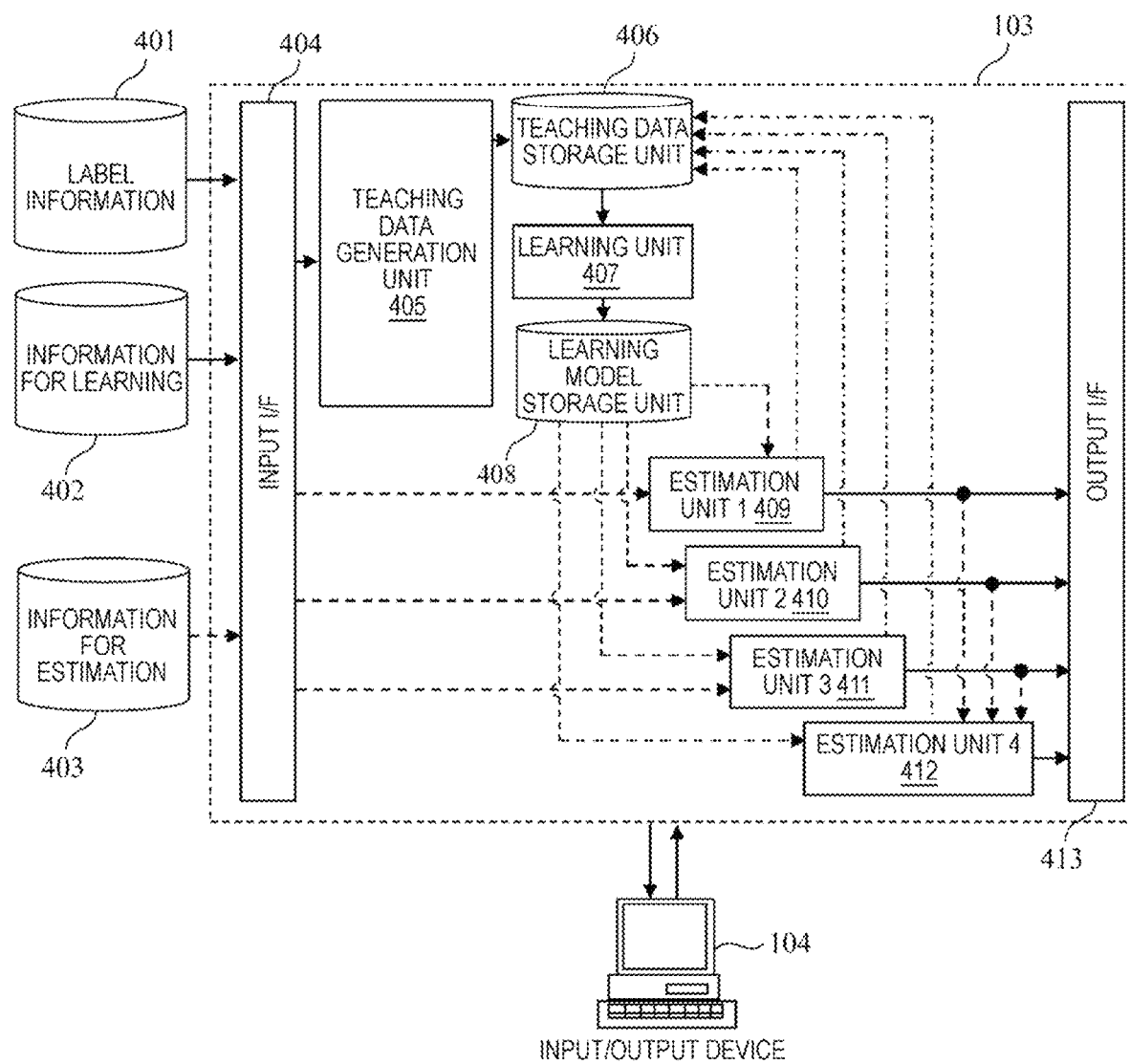
FIG. 4 is a diagram specifically showing a computer system 103 shown in FIG. 1.

FIG. 4 is a diagram specifically showing the computer system 103 shown in FIG. 1. As shown in FIG. 4, the computer system 103 includes an input interface 404, a teaching data generation unit 405, a teaching data storage unit 406 that stores teaching data generated by the teaching data generation unit 405, a learning unit 407, and a learning model storage unit 408 that stores a learning model learned based on the teaching data. Further, the computer system 103 includes an estimation unit 1 (409), an estimation unit 2 (410), an estimation unit 3 (411), and an estimation unit 4 (412) that estimate the result by inputting input data to the learning model stored in the learning model storage unit 408. Outputs (estimation results) of the estimation units are displayed by a display device or the like of the input/output device 104 through an output interface 413.

Regarding data input through the input interface 404, in a learning phase, information such as the type of an error is input from a label information storage medium 401, and recipe information, log data of the CD-SEM, sample information, and the like during occurrence of an error are input from an information for learning storage medium 402. In an estimation phase, recipe information, log data, and the like stored in an information for estimation storage medium 403 are input. The computer system 103 includes a CPU, a GPU, and the like (not shown).

When error type information, recipe information, and the like are input through the input interface 404, the teaching data generation unit 405 generates teaching data. The learning unit 407 generates a learning model for error type estimation using the teaching data stored in the teaching data storage unit 406. The learning unit 407 generates a learning model (learning device) based on the data stored in the teaching data storage unit 406 in response to a request input from the input/output device 104, and stores the generated learning model in the learning model storage unit 408.

The estimation unit estimates an error type and the like based on the learning model. The estimation unit 1 (409) estimates an error type, for example, based on an input of recipe information. The estimation unit 2 (410) estimates an error type, for example, based on an input of log data. The estimation unit 3 (411) estimates an error type, for example, based on an input of sample information. The estimation unit 4 (412) estimates an error type, for example, based on outputs of the three estimation units. An error may occur due to a plurality of error occurrence causes instead of one error occurrence cause. Therefore, in the system shown in FIG. 4, the estimation unit 4 (412) estimates a main cause for the occurrence of the error or a cause relating to the error based on the outputs of the three estimation devices. However, the estimation procedure is not limited to this example. For example, an error cause may be estimated using one estimation device.

The information estimated by the estimation unit can also be fed back as new teaching data. As indicated by an arrow such as a chain line, the information estimated by the estimation unit, a determination result of an operator, and the like may be output to the teaching data storage unit 406 as teaching data. In FIG. 4, arrows indicated by a solid line represent the flows of data in the learning phase, and broken lines represent the flows of data in the estimation phase.

The learning model is configured with, for example, a neural network. In the neural network, information input to an input layer is transmitted to an intermediate layer and an output layer in this order, and error type information and the like are output from the output layer. The intermediate layer is configured with a plurality of intermediate units. The information input to the input layer is weighted by a coupling coefficient between each of input units and each of the intermediate units and is input to each of the intermediate units. By adding the input to the intermediate unit, the value of the intermediate unit is obtained. The value of the intermediate unit is nonlinearly transformed by an input/output function. The output of the intermediate unit is weighted by a coupling coefficient between each of the intermediate units and each of output units and is input to each of the output units. By adding the input to the output unit, the output value of the output layer is obtained.

The learning progresses such that parameters (for example, constants or coefficients) such as a coefficient that describes the coupling coefficient between the units or the input/output function between the units are gradually optimized. A storage unit 305 stores the optimized values based on the learning result of the neural network. Even when a device other than the neural network is used as the learning device, the parameters optimized in the process of learning are stored in the storage unit 305. The same can be applied in the following embodiment.

The system shown in FIG. 4 inputs at least one of the acquired device information or the acquired inspection condition to the estimation device (learning device) that executes estimation based on a learning model learned using the teaching data including at least one of device information (device information stored as log data) output from the CD-SEM or a measurement condition of the CD-SEM (for example, a setting condition of a recipe) and at least one of an error occurrence cause of the inspection device, a device adjustment condition of the inspection device, or an inspection condition of the inspection device. As a result, the system outputs at least one of an error occurrence cause of the inspection device, a device adjustment condition of the inspection device, or an inspection condition of the inspection device.

Figure 5:
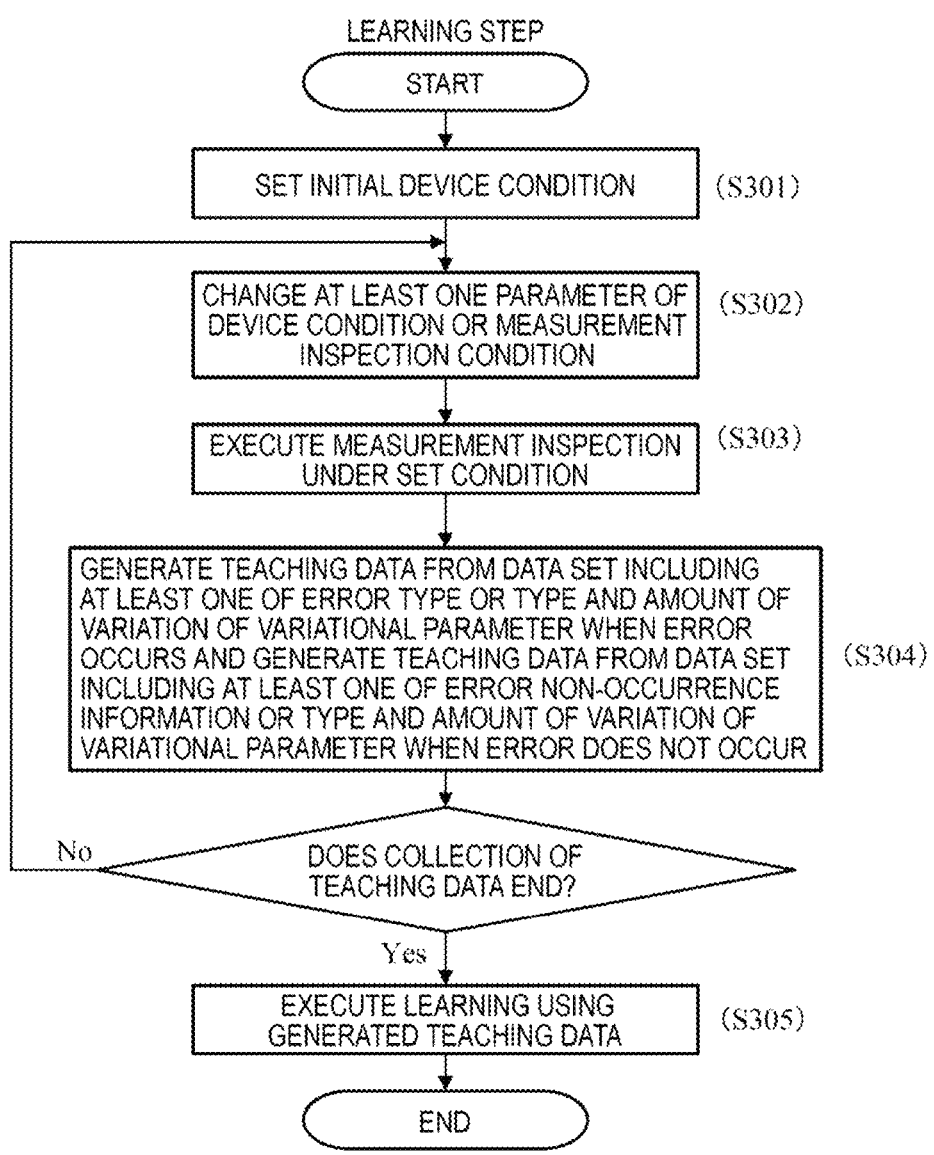
FIG. 5 is a flowchart showing a learning step of the system that, for example, specifies an error cause, estimates a reliability of a generated measurement recipe, and executes predictive diagnosis of an error.

FIG. 5 is a flowchart showing a learning step of the system that, for example, specifies an error cause, estimates a reliability of a generated measurement recipe, and executes predictive diagnosis of an error. This flowchart is executed by the computer system 103. Hereinafter, the learning phase of the system shown in FIG. 4 will be described using the flowchart shown in FIG. 5.

First, a measurement condition and a device condition of the CD-SEM are initially set (S301). The initial setting condition is, for example, a measurement condition that is appropriately set by a recipe, and is a typical device condition corresponding to the condition set by the recipe.

Next, at least one parameter of the device condition or the measurement condition is changed (S302), and a measurement process using the CD-SEM is executed under the set condition (S303). For example, among conditions set by the recipe, the FOV size of the low magnification image 1501 shown in FIG. 3 may be changed. When the FOV size is excessively decreased, the addressing pattern 1504 may deviate from a frame of the low magnification image depending on the stopping accuracy of the stage such that an addressing error occurs. On the other hand, when the FOV size is excessively large, the distance to another adjacent measurement pattern decreases, a beam is deflected by charge attached by the beam irradiation when the other measurement pattern is measured, and a measurement error or the like may occur by beam drift. Depending on the setting conditions of the recipe, an error may occur. In addition, when energy of a beam reaching a sample is changed by abnormal power supply or the like, a charge state or the visibility of an image changes, which may cause an addressing error, a focus error, or the like.

The change in the device condition or the measurement condition in S302 forms a state where an error is likely to occur. When the device operates in this state, whether or not an error occurs and the type of the error is specified, this information is set as label information of the learning device, teaching data is generated from a data set such as the type of the changed parameter, the degree of a change, or a combination of the changed parameter and another parameter (S304), and the learning device learns the teaching data (S305). As a result, a learning device that can specify the type of an error can be constructed.

It is desirable to change the parameter in order to increase or decrease the parameter with respect to the initial value, and it is desirable to change the parameter in a plurality of stages. Further, an error may occur under a composite condition where different types of parameters vary. Therefore, it is desirable to generate teaching data for each of combinations of various parameter changes.

Figure 6:
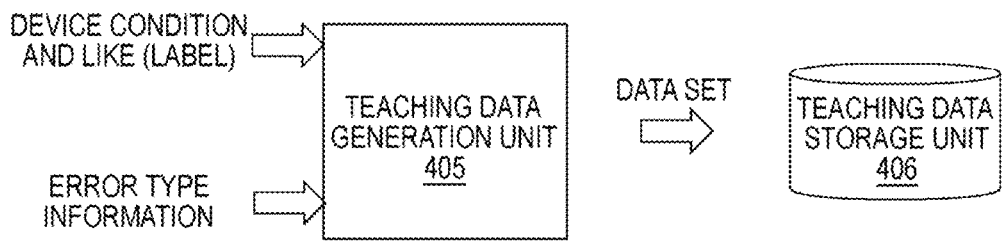
FIG. 6 is a schematic diagram showing a state where teaching data is learned.
Figure 7:
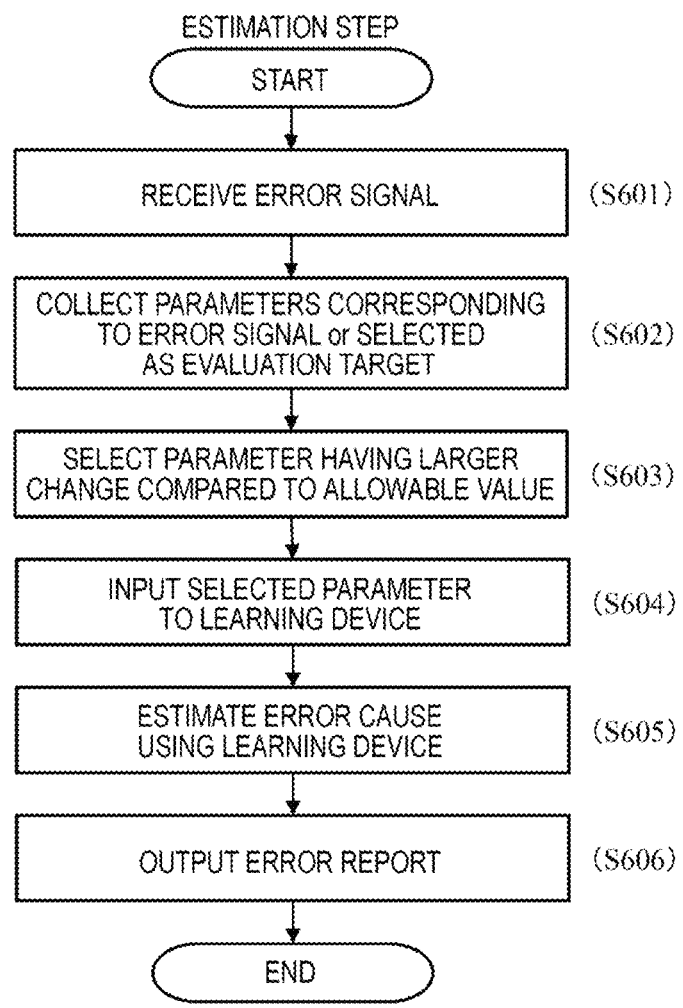
FIG. 7 is a flowchart showing an estimation phase using a learning model that is constructed through a learning phase shown in FIG. 5.

FIG. 6 is a schematic diagram showing a state where teaching data is learned. As shown in FIG. 7, by setting the device condition (the parameter variation that causes an error to occur) and the error type information as a data set and generating teaching data from the data set, a learning device that can specify an error cause can be constructed.

By setting not only the type of an error but also the amount of variation as the amount of adjustment of the parameter, teaching data can also be constructed. In this case, not only the type of the error but also a recipe adjustment condition for error recovery can also be estimated. In addition, teaching data may be generated from image data generated during occurrence of an error in association with or instead of the measurement condition and the like registered in the recipe as data for learning. When there is a correlation between a characteristic of an image and an error, predictive diagnosis of an error can be executed by generating the teaching data based on the learning data.

Further, a moving image or a plurality of continuous images can be used as the teaching data instead of a simple still image. For example, the teaching data may be generated based on a plurality of images (continuous images) acquired during execution of auto focus or a moving image generated from the plurality of images. During the execution of auto focus, basically the same FOV is continuously scanned. Charge is accumulated by plural times of scanning, which may cause image drift. In this case, the moving image or the like may include information unique to an error that does not occur in a still image. By generating teaching data based on the moving image or the continuous images, an error can be estimated with high accuracy.

FIG. 7 is a flowchart showing an estimation phase using a learning model where that is constructed through the learning phase shown in FIG. 5. When an error signal output from the CD-SEM is received (S601), the computer system 103 executes an error cause estimation process. The computer system 103 collects parameter information corresponding to the error signal and selected as evaluation targets or all of the parameter information as evaluation targets from each of the storage media or the CD-SEM (S602). Depending on the type of an error, there may be a case where the parameters can be specified. In this case, the parameters are selected as a pre-processing of the estimation using the learning device. In addition, an allowable value may be prepared in advance such that only parameters having a large variation exceeding the allowable value are selected (S603) to execute the estimation.

The computer system 103 inputs the parameters selected or collected as described above to the learning device (estimation unit) (S604), so as to acquire an estimation result such as an error cause as an output of the learning device (S605). The computer system 103 outputs the estimated error cause (S606).

In the flowchart of FIG. 7, when the error signal output from the CD-SEM or the like is received, the step of estimating an error cause is shown. A state where a phenomenon that causes a decrease in measurement accuracy or the like occurs may be estimated, instead of the error signal, based on reception of information that is not recognized as an error but represents the possibility that appropriate measurement or inspection is not executed, for example, a decrease in dimension measurement result or in matching score during addressing or a mistake in detection position of addressing. For example, when the dimension measurement result of the pattern deviates from a predetermined allowable range, the pattern itself may be deformed. On the other hand, when an edge is blurred by a focus error or the like, the dimension measurement result may represent an abnormal state. Accordingly, by executing the estimation process in response to a variation in the dimension measurement result or the like (that is, when the measurement accuracy deviates from a predetermined allowable range in advance), a timing at which the recipe or the like is optimized or an abnormal state caused by the device occurs can be specified.

FIG. 8 is a diagram showing an example of a report that describes a result of estimating an error cause by the computer system 103. The output information of the report includes error information output from the CD-SEM and an estimation result estimated by the learning device. Specifically, the type of an error is displayed or printed in the field Error Detail based on the type of an error output from the CD-SEM. Here, for example, when addressing is not appropriately executed, an addressing error is reported, and when focus adjustment is not appropriately executed, a focus error is reported.

For example, in the case of an addressing error, when image recognition using the template image 1503 shown in FIG. 3 cannot be executed (for example, when pattern matching using the template image 1503 is executed in the low magnification image 1501, the search for a point having a degree of agreement of a predetermined threshold or more is failed or a plurality of candidates are searched for), the CD-SEM outputs error information (for example, a type, a degree, or an evaluated value of evaluating an error; in this example, an addressing error, a score representing a degree of agreement of pattern matching, or a threshold for evaluating the score) to the computer system 103.

When the error signal is received, the computer system 103 estimates an error cause and reports the result thereof. As shown in FIG. 8, the computer system 103 outputs the estimation result by the estimation device as an error score in association with the recipe information, the sample information, and the device information (log data). The error score outputs, for example, a probability of an error cause. The score is an output of a neural network where a parameter of each of neurons is tuned, for example, using an error back propagation method. In addition, the degree to which each of parameters in the recipe information contributes to an error may be converted into a coefficient such that the output of the estimation device is multiplied by this value to calculate the error score.

FIG. 9 is a flowchart showing a step of causing the learning device to execute learning in response to an error that occurs when a recipe is executed as a trigger. This flowchart is executed by the computer system 103. The computer system 103 may execute the learning process before starting the operation of the image acquisition tools, may execute the learning process during the execution of the recipe as in the flowchart, or these configurations may be combined.

First, error information output from the CD-SEM during occurrence of an error and at least one of recipe information, log data, or the sample information at the time are collected (S1301), and teaching data is generated from the data set (S1302). Further, the log data or the like is regularly collected, and teaching data having a normal state as a label is generated (S1303). The learning device is configured such that two states including a normal state and an error state are estimated, and the measurement state is estimated using this learning device. As a result, a prediction of an error can be determined.

For example, by regularly collecting the log data and the like and inputting the log data and the like to two estimation devices including a normal state evaluation estimation device and an error occurrence estimation device, an estimation result is obtained from each of the estimation devices. In the estimation result, when the score of the normal state decreases and the score of the error state increases, an error may occur. Predictive diagnosis of error occurrence can be executed based on the evaluation of the outputs of the two estimation devices.

Figure 10:
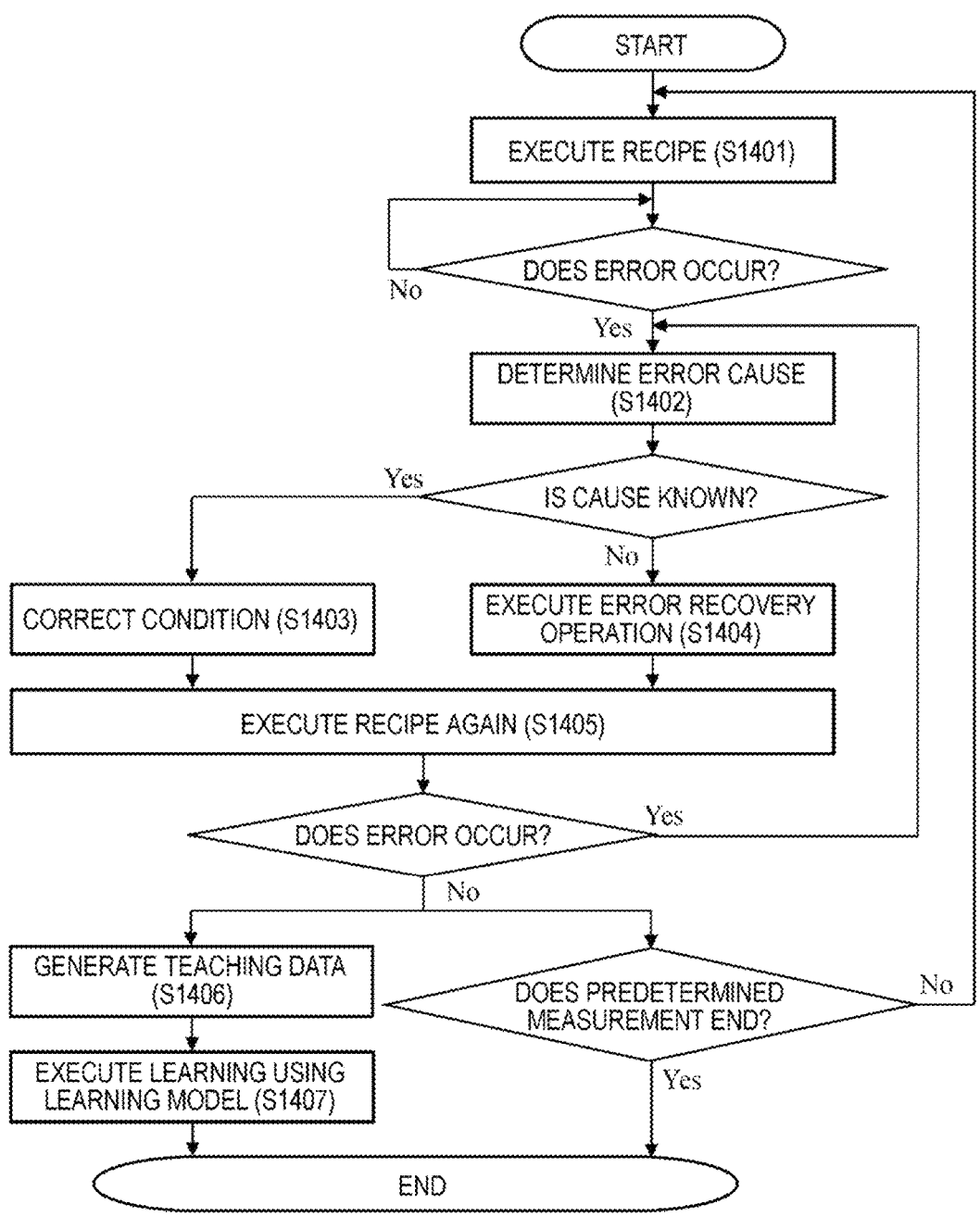
FIG. 10 is a flowchart showing a step of recovering a device and relearning a learning model during occurrence of an error.

FIG. 10 is a flowchart showing a step of recovering a device and of relearning a learning model during occurrence of an error. This flowchart is executed by the computer system 103. In addition to the flowchart described above, as shown in this flowchart, the computer system 103 may execute the recipe again in a state where the recovery process is executed during occurrence of an error, and may execute the relearning based on the result of the re-execution.

When the recipe is executed (S1401) to execute the measurement process and an error occurs, the computer system 103 determines the error cause based on the flowchart of FIG. 7 (S1402). The determination of the error cause in S1402 may be executed by an operator who is skillful in handling the device. When the error cause is known (when the determination result of the learning device is a predetermined score or more or when the determination of the operator is reliable), the recipe correction or the device adjustment is executed (S1403). On the other hand, when the error cause is unclear, the error recovery operation is executed in a state where the device is stopped (S1404).

When the cause is not known, an operation that requires specialty is necessary. Therefore, when the steps up to S1402 are executed by the measurement system 10 of a user and it is difficult for an engineer of the system or the user to determine the cause, the difficulty may be transmitted to the management system (the diagnosis system of FIG. 2) of the measurement system 10. In this case, the error cause is determined by a higher-order learning model that is learned by teaching data provided from a plurality of users or an expert who belongs to a management company, and the recovery operation is executed.

After executing the adjustment and the like in S1403 to S1404, the recipe is executed again (S1405). When an error does not occur during the re-execution, it can be determined that a countermeasure in S1403 or S1404 is right. Therefore, the computer system 103 generates teaching data by using the error information and the correction information that describes the content of correction in S1403 or S1404 as a data set (S1406), and relearns the learning model using this data set (S1407).

By executing the operation shown in the flowchart of FIG. 10, a learning device that can output an appropriate countermeasure based on the input of the error type that occurs can be generated.

Figure 11:
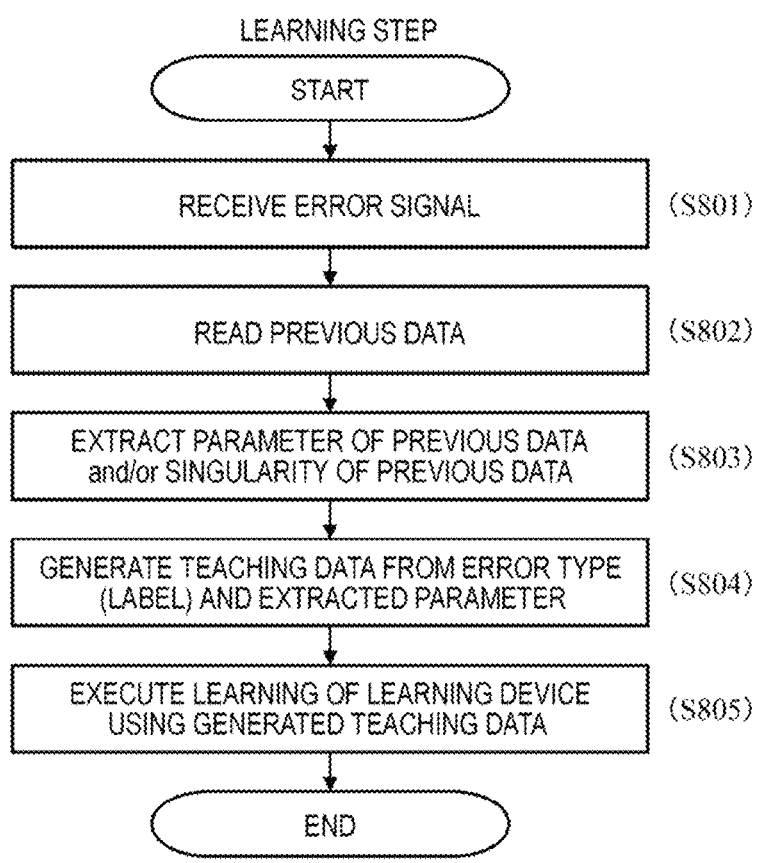
FIG. 11 is a flowchart showing a learning step of a learning device that executes predictive diagnosis.

FIG. 11 is a flowchart showing a learning step of a learning device that executes predictive diagnosis. This flowchart is executed by the computer system 103. The computer system 103 can construct a learning device that can execute predictive diagnosis in the procedure of the flowchart instead of or together with the flowchart shown in FIG. 9.

The computer system 103 receives the error signal (S801) and subsequently reads previous data stored in the log data and the like (S802). The previous data described herein refers to a previous recipe, previous log data, previous sample data, or the like. For example, at a time that is earlier than the occurrence of the error by a predetermined period of time, the amount of movement of the field of view during addressing, the duration during focus adjustment, the dimension measurement result, and the like are read. In the previous data, a singularity of the parameter that is rapidly changed may be selectively read (S803). Specifically, an index value representing a change of the parameter, an amount of change per predetermined period of time, or information representing whether or not a predetermined allowable value is exceeded may be selectively read. Instead, all of parameters acquired at a predetermined timing may be acquired. Further, instead of the parameter itself, a change rate or a characteristic variation of the parameter may be output as an index value or a flag to be read.

The computer system 103 uses the type of an error as a label, generates teaching data based on information regarding the type of the error and the read or extracted parameter (S804), and causes the learning device to learn the generated teaching data (S805).

Figure 12:
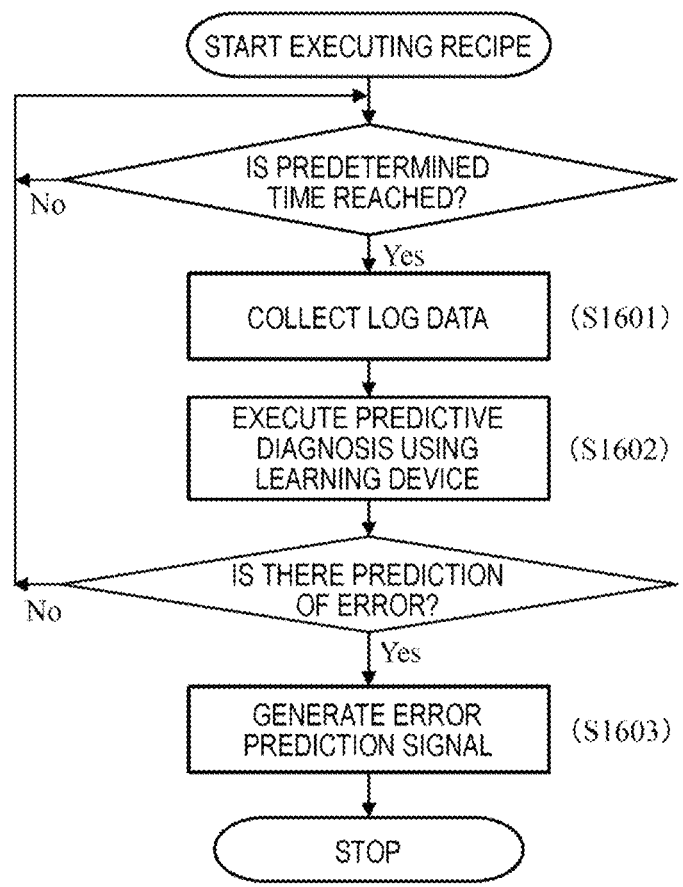
FIG. 12 is a flowchart showing a procedure of diagnosing a prediction of an error using the learning model that is learned based on FIG. 11.

FIG. 12 is a flowchart showing a procedure of diagnosing a prediction of an error using the learning model that is learned based on FIG. 11. This flowchart is executed by the computer system 103.

The computer system 103 collects log data at intervals of a predetermined time (S1601), and inputs the collected data to the learning model that is learned through the steps shown in FIG. 11, so as to execute predictive diagnosis of the error (S1602). The learning device learns the information of the error type that actually occurs and is specified and the information such as the log data before the error occurs. Therefore, when there is a cause and effect relationship between an event before the occurrence of an error and the error, the occurrence of the error can be estimated before the error actually occurs.

When the learning device estimates the occurrence of a subsequent error with a predetermined probability, the computer system 103 can generate a prediction signal (S1603) to urge the user of the device to take a countermeasure such as maintenance or a change in measurement condition. When the log data before the occurrence of the error shows a characteristic change, teaching data is generated from information regarding the parameter state and information such as a period of time from the characteristic change to the occurrence of the error, the number of measurement points, the number of wafers, or the number of lots, and the learning device learns the teaching data. As a result, a learning device that outputs a period of time taken until the occurrence of the error can be obtained.

Figure 13:
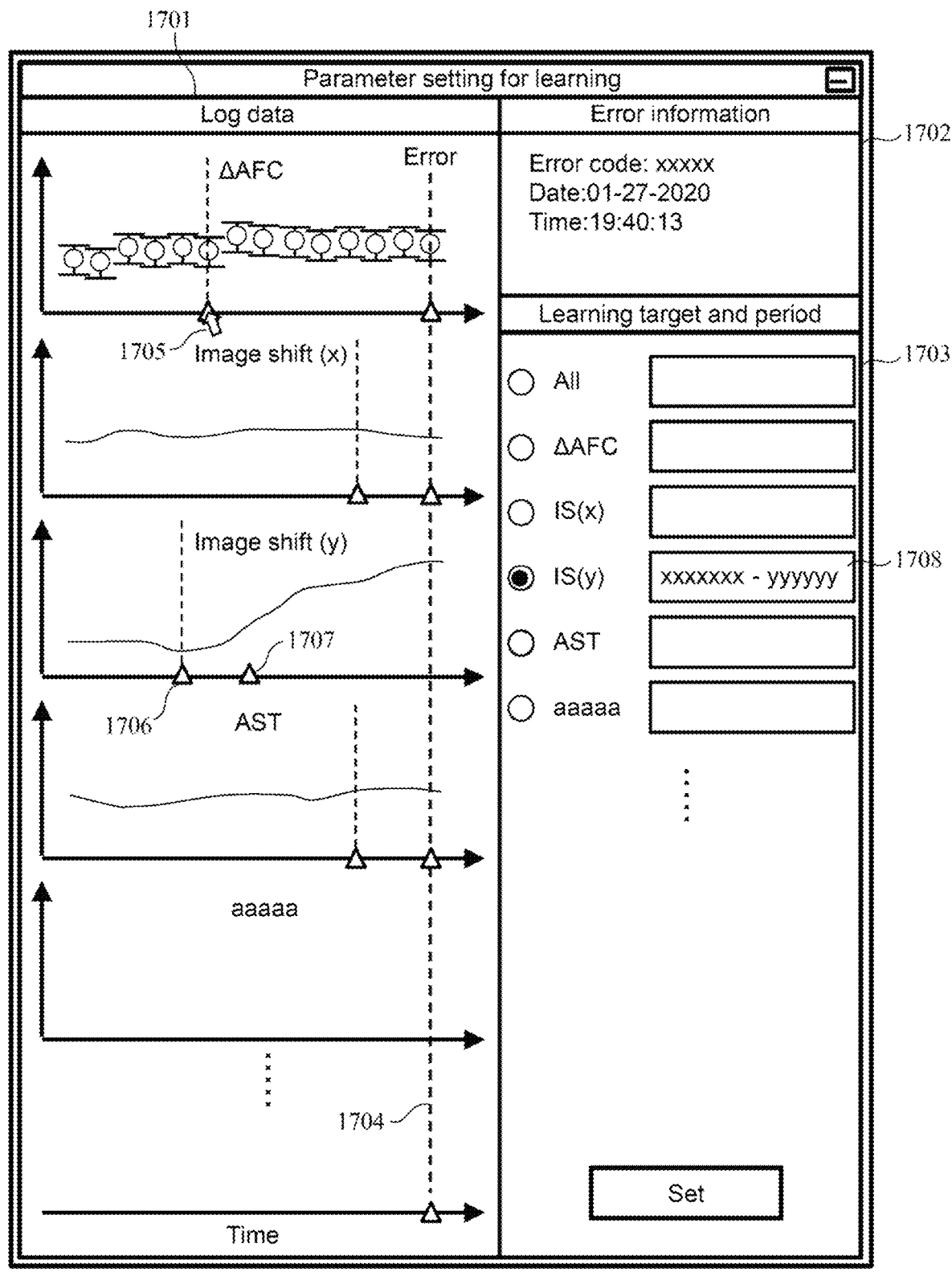
FIG. 13 is a diagram showing one example of a GUI screen that sets a learning condition where the learning device executes learning using error type information and log data output from a CD-SEM or the like when an error occurs.

FIG. 13 is a diagram showing one example of a GUI screen that sets a learning condition where the learning device executes learning using the error type information and the log data output from the CD-SEM or the like when an error occurs. A GUI screen shown in FIG. 13 includes: a log data display field 1701 for displaying a time change of the log data output from the CD-SEM or the like and stored in the log information storage medium 113; a display field 1702 of the error information output from the CD-SEM or the like; and a setting field 1703 for setting data as a learning target.

The log data display field 1701 displays transition of a plurality of parameters stored in the log data and a bar 1704 representing a timing at which the error occurs. Further, the log data display field 1701 displays a pointer 1705 that can be operated by a pointing device (not shown) or the like, and displays a left side slider 1706 and a right side slider 1707 that are movable along the horizontal axis of the graph by the pointer 1705.

By selecting the time using the left side slider 1706 and the right side slider 1707, information representing a change of the parameter in the range can be selected as teaching data. For example, by selecting a parameter that shows a unique behavior relating to the error at a specific time, learning can be executed with high efficiency. In addition, the time selection can be executed by inputting the time to a time setting field 1708 provided in the setting field 1703.

Second Embodiment

In the first embodiment, the configuration example where the learning device learns the teaching data is described. Instead, a learning model can also be generated by unsupervised learning based on a parameter in a normal state (during non-occurrence of an error). For example, on a regular basis or in a process where an error is more likely to occur as compared to other processes, the learning device stored in the computer system 103 stores a parameter when an error does not occur, and executes unsupervised learning. The learning device that is learned by the unsupervised learning generates a non-error-occurrence score in the process where an error does not occur and outputs the non-error-occurrence score. In addition, the learning device generates an error-occurrence score during occurrence of an error by unsupervised learning, and outputs the error-occurrence score.

The computer system 103 determines a prediction of the occurrence of an error by receiving the output score from the learning device and determining whether the output score is the non-error-occurrence score or the error-occurrence score. An error may occur under a composite cause of the recipe setting condition, the device condition, the sample condition, and the like, and it may be difficult to accurately specify the cause. In this case, by applying machine learning, a correlation can be extracted.

The recipe setting condition, the device condition, the sample condition, and the like are input to the learning model generated by unsupervised learning, and the score obtained from the learning device based on the input is compared to the non-error-occurrence score of the learning model when an error does not occur. When the score is abnormal, a prediction of the occurrence of an error can be detected based on this score. After learning, data when an error occurs may also be input to the learning device such that the output score is compared to the non-error-occurrence score to determine the range of the non-error-occurrence score. In this case, when the output score deviates from the set score range, the computer system 103 generates a warning for the occurrence of an error.

In the case of unsupervised learning, data during non-occurrence of an error can be selectively input to execute learning. In the mass production step of a semiconductor device, frequent occurrence of an error is uncommon, and it may be difficult to collect data required for learning using data (parameter) during occurrence of an error. As compared to occurrence of an error, a large amount of data can be obtained during non-occurrence of an error (when no error occurs). Therefore, learning can be executed based on a sufficient amount of learning.

Figure 14:
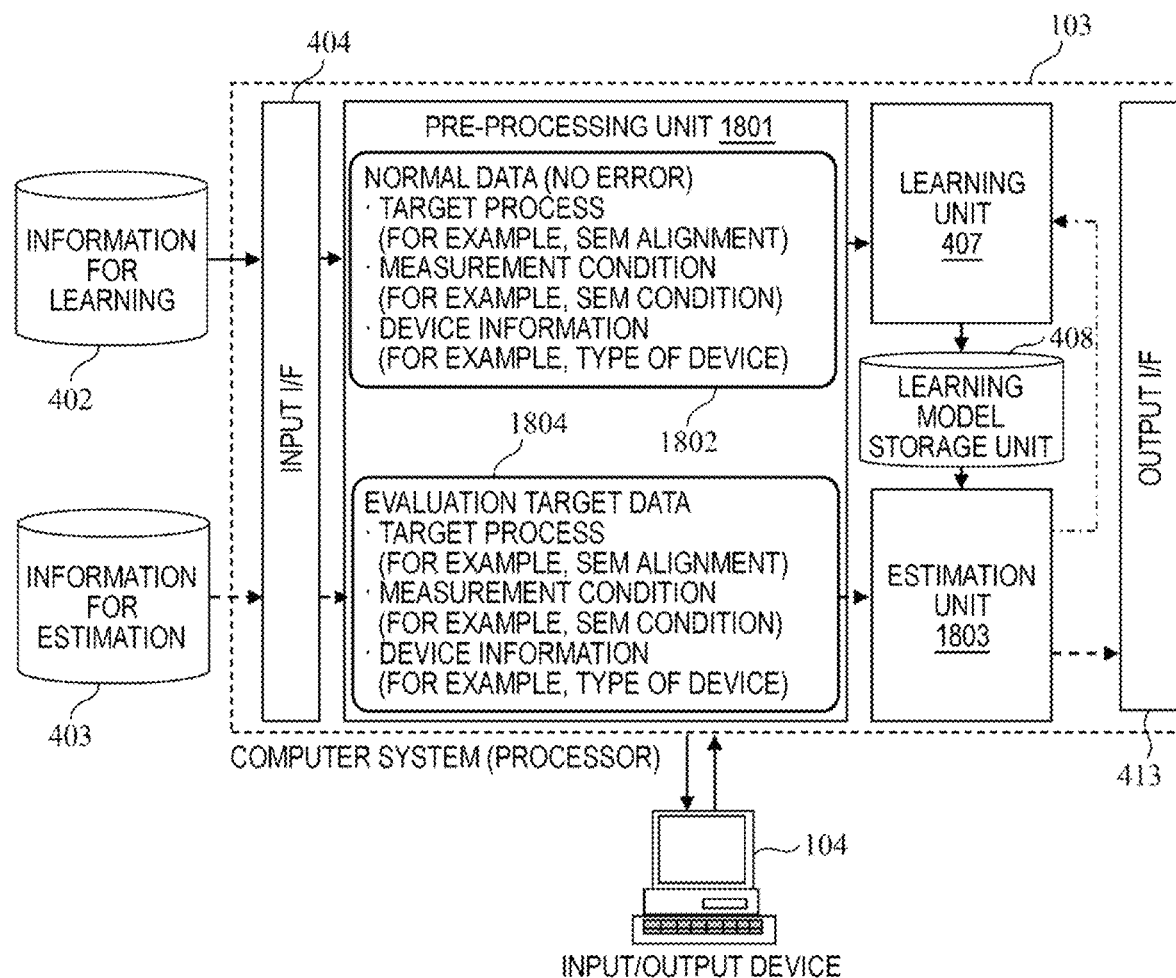
FIG. 14 is a diagram showing one example of a diagnosis system that executes unsupervised learning and diagnoses an error cause using a learned model generated based on the unsupervised learning.

FIG. 14 is a diagram showing one example of a diagnosis system that executes unsupervised learning and diagnoses an error cause using a learned model generated based on the unsupervised learning. The system shown in FIG. 14 includes a pre-processing unit 1801 that generates data for learning 1802 of the learning unit 407 based on information for learning output from the CD-SEM or the management device that manages the CD-SEM. The pre-processing unit 1801 generates the data for learning 1802 by receiving data in a state where the CD-SEM or the like operates normally.

The data for learning 1802 includes at least one of information regarding a target process, information regarding a measurement condition, or device information. The target process in the CD-SEM is, for example, SEM alignment of aligning a coordinate system of a sample stage of an electron microscope and a coordinate system recognized by the electron microscope, addressing, AF adjustment, AST, or ABCC. In addition, the measurement condition is, for example, a FOV size acquired during the addressing, the number of images acquiring during the AF adjustment, a cumulative number of frames, a distance (or a deflection signal amount) between an EP point and an AF adjustment pattern, a direction, or various lens conditions. In addition, the measurement condition may be, for example, a distance (or a deflection signal amount) between an EP point and an AF adjustment pattern during an actual measurement. For example, when a plurality of CD-SEMs as management targets of the computer system 103 are present, the device information may be information regarding a device attribute such as identification information of the device or information regarding an environment where the device is provided.

The pre-processing unit 1801 generates a data set based on one or more of the above-described parameters. The learning unit 407 clusters plural combinations of the plurality of parameters based on the data for learning 1802, and generates one or more clusters for each of the combinations of the parameters by the clustering.

Figure 15:
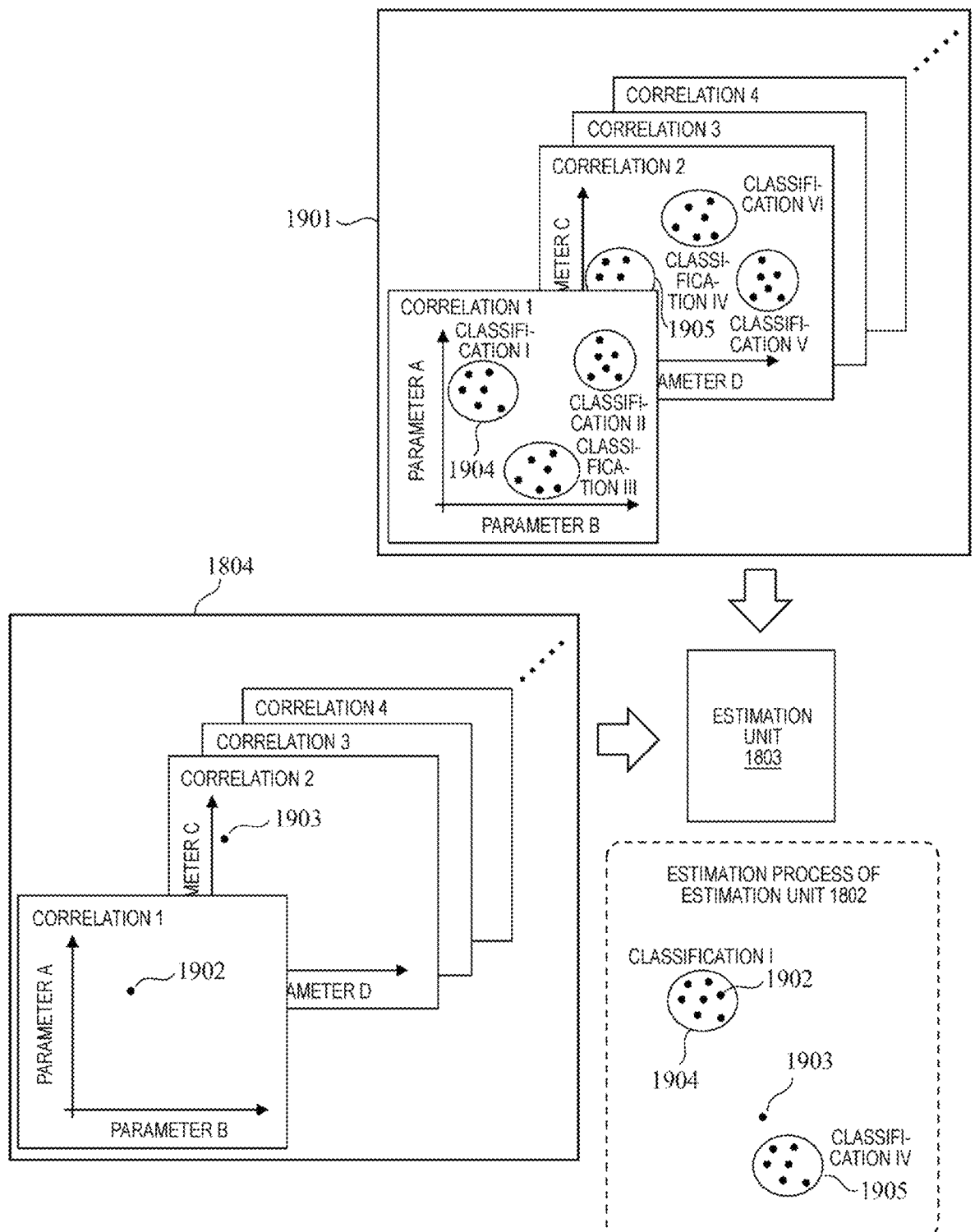
FIG. 15 is a schematic diagram showing a learning model that is constructed by clustering.

FIG. 15 is a schematic diagram showing a learning model that is constructed by clustering. As shown in FIG. 15, one or more clusters (for example, a classification I, a classification II, and a classification III) are generated for each of combinations (for example, a parameter A and a parameter B) of a plurality of parameters to generate a learning model 1901. The learning model 1901 includes a plurality of clusters for each of combinations of a plurality of parameters, and an estimation unit 1803 executes an estimation process using this learning model.

The computer system 103 determines an error cause of evaluation target data based on evaluation target data 1804 output from the pre-processing unit 1801. Specifically, whether or not correlation data for each of combinations of a plurality of parameters in the evaluation target data is included in one or more clusters in the learning model is determined, and a parameter relating to correlation data that is not included in the clusters is determined to be abnormal. More specifically, whether or not evaluation target data 1902 is included in the ranges defined by classifications I, II, and III of correlation data 1 is determined. In the example of FIG. 15, the evaluation target data is included in a range 1904 (range defined by the cluster of the classification I) of the correlation 1, and thus is determined to be normal. On the other hand, evaluation target data 1903 of a correlation 2 does not belong to any one of classifications IV, V, and VI defined by a correlation 2. Therefore, this data is determined to be abnormal.

By executing the estimation using the learning device on which the unsupervised learning is executed as described above, an abnormal parameter can be specified. When the measurement target data is not included in all of the classifications set by a plurality of correlation data or a predetermined number or more of classifications, there may be a possibility that the learning model is not appropriately learned. Therefore, for example, it is desirable to regenerate the model.

When the manufacturing step of a semiconductor device reaches a mass production step through a research and development stage, the occurrence frequency of an error decreases, and it is difficult to generate a learning model where data obtained during occurrence of an error is teaching data. On the other hand, when an error occurs and a long period of time is required to specify a cause for the error, the manufacturing efficiency of a semiconductor device may decrease. Accordingly, although the frequency is low, rapid device recovery is required. Even in a state where the error occurrence frequency is low, the learning model generated through the unsupervised learning can execute appropriate estimation.

Figure 16:
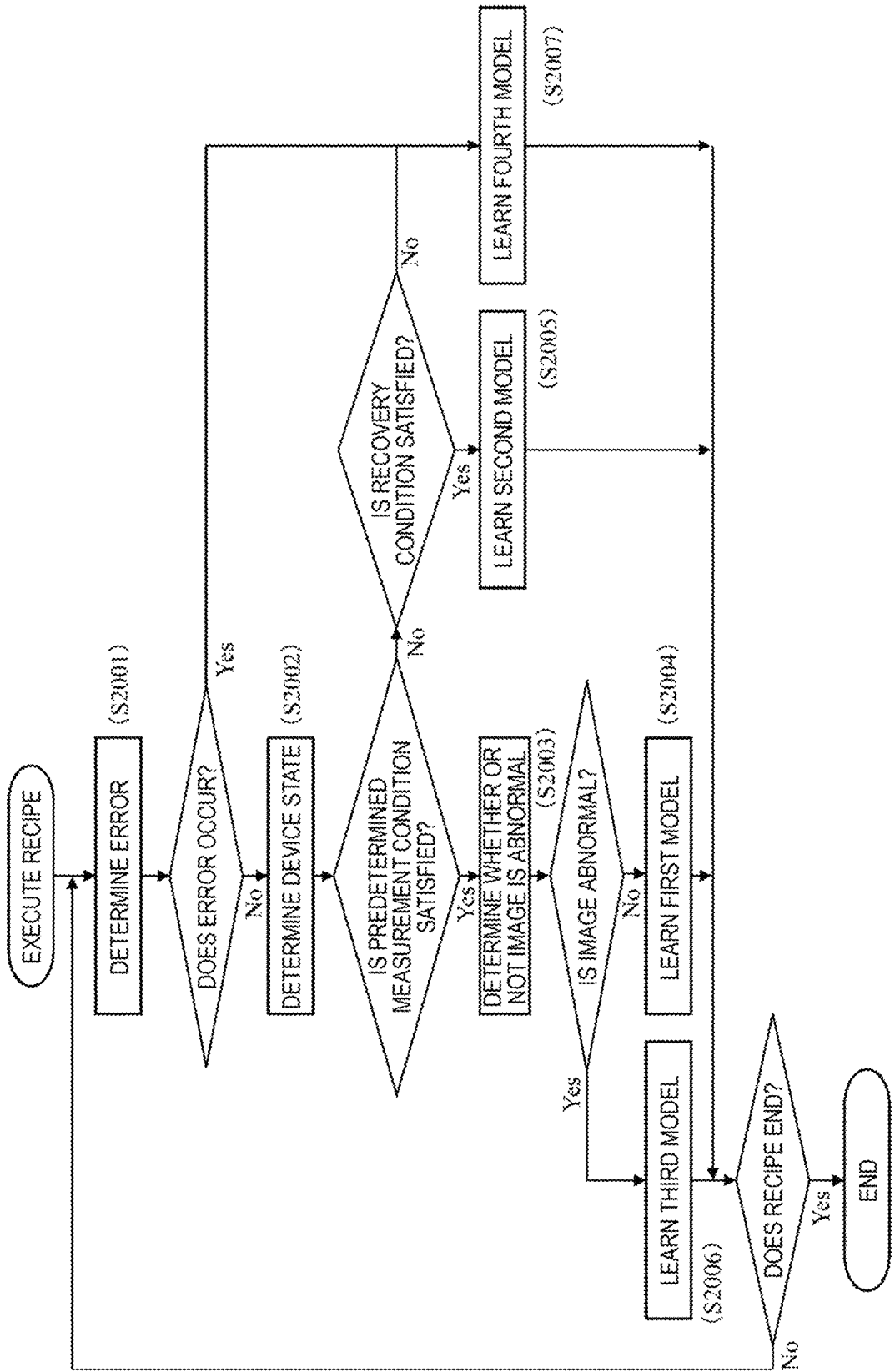
FIG. 16 is a flowchart showing a step of learning a learning model by unsupervised learning.

FIG. 16 is a flowchart showing a step of learning a learning model by unsupervised learning. The flowchart shown in FIG. 16 also includes steps of learning different learning models when the CD-SEM does not operate normally or when there is a possibility that the CD-SEM does not operate normally.

First, the computer system 103 determines that an error does not occur in the CD-SEM based on the data output from the CD-SEM or the like, and determines the device state and the like at this time (S2001, S2002). The device state can refer to, for example, the evaluation target data 1804. Next, whether or not measurement is executed under a predetermined measurement condition is determined. When the measurement is executed, whether or not the image is abnormal is determined (S2003). When the predetermined measurement condition is not satisfied, whether or not measurement is executed under a recovery condition is determined. The abnormality determination procedure in S2003 will be described below.

Based on the device information and the like obtained when the image is not abnormal in the abnormality determination step of S2003, the learning model (first learning unit) based on normal data is learned or relearned (S2004). The learning data (learning data for the first learning unit) generated through the steps shown in FIG. 16 is obtained when an error does not occur and there is a low potential that an error occurs as described below. Therefore, a model that is suitable for the error cause determination can be constructed through unsupervised learning. That is, by clustering (a) the content of the target process, (b) the measurement condition, and (c) device information when an error does not occur and the image is normal, it can be estimated that an error does not occur when these parameters belonging to this cluster are used. In other words, it can be estimated that an error occurs when parameters that deviate from the cluster are used.

According to this flowchart, based on the device condition and the like in a state where an error does not occur but there is a potential that an error occurs, a learning model that specifies a possible error or a cause for the error can be constructed. A second learning model (second learning unit) generated in S2005 is generated based on the device condition and the like when the measurement is executed under the recovery condition. The recovery refers to a process for executing a process that is prepared in advance to avoid an error or the like under a measurement condition that is not ideal. One specific example is a search for a field of view by search around. As shown in FIG. 3, in order to specify the position of the measurement target pattern 1502, addressing may be executed. There may be a case where the low magnification image 1501 acquired for addressing does not include the addressing pattern. When a pattern having a high degree of agreement is not found by template matching (a portion where the degree of agreement is a predetermined value or higher is not present), the recovery can be executed by executing search around. The search around is a process of searching for an appropriate field of view by circulating fields of view in a peripheral region around the current field of view. An example of the search around will be described below using FIG. 17.

On the other hand, the execution of the search around represents that the low magnification image 1501 cannot be appropriately acquired, and represents a state where the device condition is not appropriately set or a state where there is a high possibility that an error will occur in the future. Therefore, when the recovery process is executed, the device condition and the like are selectively collected, and a model (second learning unit) based on this collection is generated. As a result, a model that estimates a prediction of an error can be constructed.

Examples of the recovery process other than the search around include: (a) when a lens condition where the focus evaluated value is a predetermined value or more is not found during the execution of the auto focus, a variation range of the lens condition is extended to execute the auto focus; and (b) a process of repeating (retrying) the same process multiple times. The retry process is not limited to the above-described processes, and refers to all of processes that are selectively executed when any malfunction occurs.

When an error does not occur but at least one of (a) the content of the target process, (b) the measurement condition, or (c) the device information is abnormal, the second learning model further clusters (a) the content of the target process, (b) the measurement condition, or (c) the device information during the execution of the recovery process. As a result, it can be estimated that an error does not occur when these parameters belonging to this cluster are used, and if the recovery process is executed, whether or not the error can be recovered by the recovery process can be estimated.

Even when an error cannot be recovered by the recovery process, a fourth learning model (fourth learning unit) that clusters these parameters may be generated (S2006). As a result, it can be estimated that an error does not occur when these parameters belonging to this cluster are used, and if the recovery process is executed, whether or not the error can be recovered by the recovery process can be estimated. For example, the estimated score of the third model and the estimated score of the fourth model are compared such that whether or not the recovery process can be executed can be estimated based on which one of the estimated values is higher.

The device conditions and the like obtained when the image and the like acquired in S2003 are determined to be abnormal may be collected to construct a third learning model (third learning unit) (S2006). With the model constructed as described above, a state where an error does not occur but appropriate measurement cannot be executed can be determined. That is, by clustering (a) the content of the target process, (b) the measurement condition, and (c) the device information when an error does not occur, the measurement condition is normal, but the image is abnormal, it can be estimated that an error does not occur but the image is abnormal when these parameters belonging to the cluster are used.

When the error signal is received from the CD-SEM or the like, the computer system 103 constructs the fourth learning model (S2007). The error signal is received from the CD-SEM, and the type of an error is specified. Therefore, in this case, supervised learning having the type of the error as a label may be executed.

Figure 17:
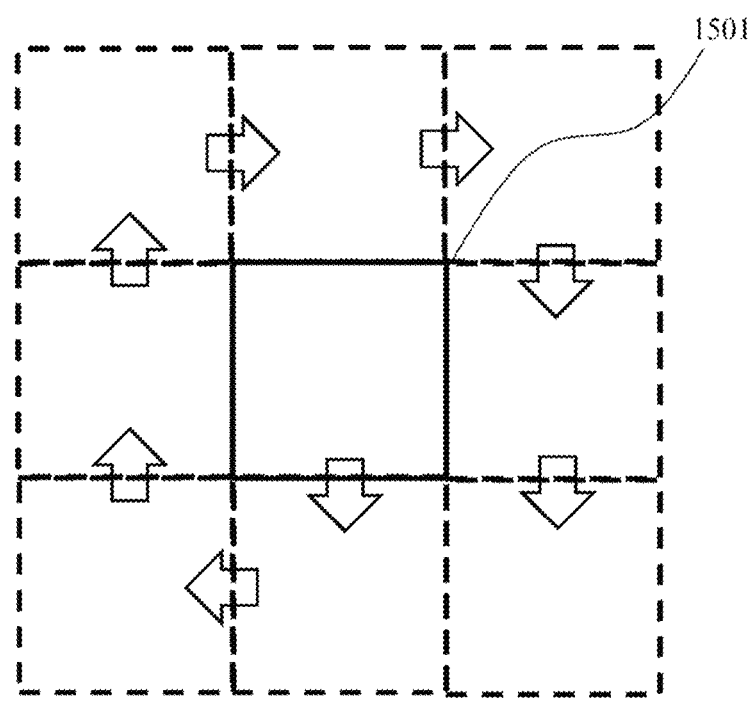
FIG. 17 is a schematic diagram showing a state where search around is executed.

FIG. 17 is a schematic diagram showing a state where search around is executed. As shown in FIG. 17, by moving the field of view to surround the periphery of the initial low magnification image 1501 and executing pattern matching at each of field-of-view positions to execute search around, the addressing pattern 1504 can be found.

FIG. 18 is a diagram showing an example of the abnormality determination executed in S2003. The upper diagram in FIG. 18 shows a peripheral image 2101 of a measurement target pattern 2102. By specifying the field-of-view position as a field-of-view position 2105 including the measurement target pattern 2102 by addressing, an image 2107 can be acquired. On the other hand, due to failure of addressing, the influence of charging, pattern deformation caused by a process variation, or the like, the field of view is shifted, and an image 2108 at a field-of-view position 2106 is acquired. When a pattern 2103 is measured, a pattern different from a desired pattern is measured. In this case, an error does not occur in the device, but data output from the device is abnormal data.

Therefore, in order to detect whether or not this abnormality occurs, for example the same image data (template) as the image 2107 may be prepared in advance, and the degree of agreement of pattern matching may be evaluated during the abnormality determination of S2003 to determine whether or not the acquired image is appropriate (whether or not the acquired image is an image at an erroneous position). Another pattern 2104 is formed on the image 2107 for length measurement acquired at an appropriate field-of-view position, and the degree of agreement is higher than that when template matching is executed on the image 2108. Accordingly, when the degree of agreement falls below a predetermined value, it may be determined that abnormal data is output. In addition, for the abnormality determination, the sharpness, the amount of movement of the field of view, and the like of the image may be determined as an evaluation target.

The above-described abnormality determination is executed to appropriately select a model as a learning target. Therefore, the abnormality determination may be executed after data is accumulated to some extent instead of being executed during actual execution of the recipe.

The learning model may be learned in real time during the execution of the measurement process of the CD-SEM or the like or may be learned at a stage where data is accumulated off line to some extent. Further, in the computer system that manages a plurality of CD-SEMs, in a case where an abnormality unique to the specific device occurs, when the measurement is executed using the same recipe, the occurrence of an abnormality derived from the hardware of the device may be considered. Therefore, a model derived from the hardware may be separately generated, or when the first to fourth learning models are generated, identification information of the device may be included in the learning data.

Third Embodiment

Figure 19:
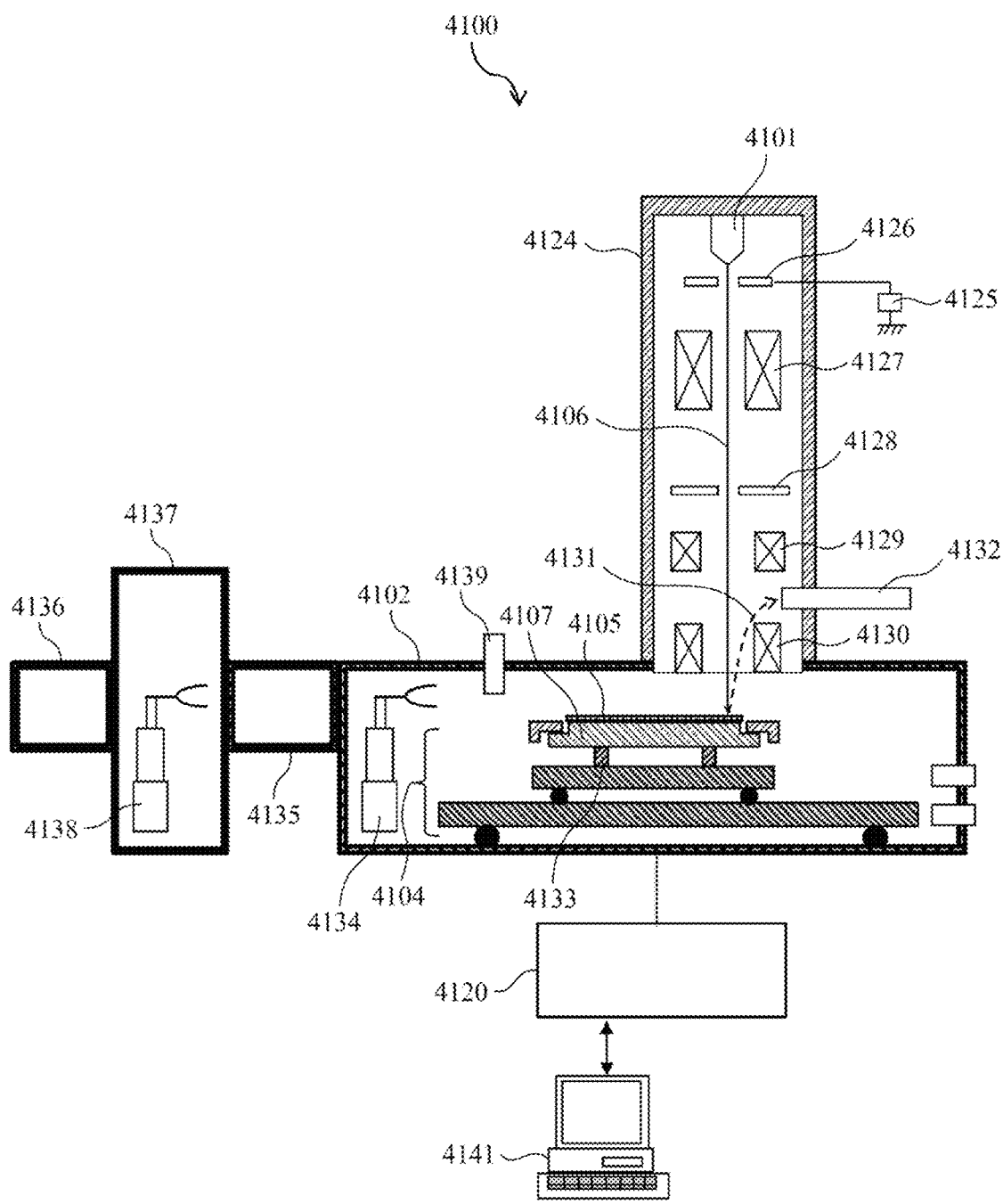
FIG. 19 is a diagram showing a configuration of a device 4100 according to a third embodiment of the present disclosure.

FIG. 19 is a diagram showing a configuration of a device 4100 according to a third embodiment of the present disclosure. For example, the device 4100 is formed as the CD-SEM. Electrons emitted from an electron source 4101 that is held in a casing 4124 maintained in a high vacuum are accelerated by a primary electron acceleration electrode 4126 to which a high voltage is applied from a high voltage power supply 4125. An electron beam 4106 (charged particle beam) is converged by an electron lens 4127 for convergence. The electron beam 4106 is adjusted in beam current amount by an aperture stop 1828, is deflected by a scan coil 4129, and is two-dimensionally scanned on a wafer 4105. The electron beam 4106 is narrowed and focused by an electron objective lens 4130 disposed immediately above a semiconductor wafer (hereinafter, simply referred to as "wafer") 4105 as a sample and is incident on the wafer 4105. Secondary electrons 4131 generated when primary electrons (electron beam 1806) are incident are detected by a secondary electron detector 4132. The amount of secondary electrons detected reflects the shape of the sample surface.

Therefore, the shape of the surface can be imaged based on the information of the secondary electrons.

The wafer 4105 is held on an electrostatic chuck 4107 while securing a given degree of flatness, and is fixed to an X-Y stage 4104. FIG. 19 is a cross-sectional view showing the casing and an internal structure thereof when seen from the horizontal direction. Accordingly, the wafer 4105 is operable in both of the X direction and the Y direction, and any position in a wafer plane can be measured. In addition, on the X-Y stage 4104, a lift mechanism 4133 for conveying a wafer into which a vertically operable elastic body is incorporated is provided to attach and detach the wafer 4105 to and from the electrostatic chuck 4107, and the wafer 4105 can be delivered to and from a load chamber (preliminary exhaust chamber) 4135 in cooperation with a conveyance robot 4134. The computer system 4120 controls the positioning of the X-Y stage 4104 based on a detection signal from a position detector (for example, a laser displacement meter) that detects the position of the X-Y stage 4104 in real time and a measurement time, and tracking information (log information and movement history information) (relationship between the time and the position) relating to the movement position of the X-Y stage 4104 is recorded in a recording device described below.

The operation of conveying the wafer 4105 as a measurement target to the electrostatic chuck 4107 will be described. First, a wafer set on a wafer cassette 4136 is conveyed to the load chamber 4135 in a mini environment 4137 using a conveyance robot 4138. The inside of the load chamber 4135 can be evacuated and the atmosphere can be released by a vacuum evacuation system (not shown), and by opening and closing a valve (not shown) and operating the conveyance robot 4134, while maintaining the vacuum degree in the casing 4124 at a level where there is practically no problem, the wafer 4105 is conveyed to the electrostatic chuck 4107. A surface electrometer 4139 is attached to the casing 4124. The surface electrometer 4139 is fixed to a position in a height direction where the distance from a probe tip is appropriate such that the surface electrometer 4139 can measure a surface voltage of the electrostatic chuck 4107 or the wafer 4105 without contact.

Each of the components of the device 4100 can be controlled using a general-purpose computer. FIG. 19 shows an example where the configuration of the control system is implemented by the computer system 4120. The computer system 4120 includes at least a processor such as a Central Processing Unit (CPU), a storage unit such as a memory, and a storage device such as a hard disk (including an image storage unit). The storage device may be configured to include the same storage media as the measurement recipe storage medium 105, the log information storage medium 113, the sample information storage medium 106, and the design data storage medium 114 described above in detail with reference to FIG. 1, and the same information as that of FIG. 1 may be configured to be recorded in each of the storage media. Further, for example, the computer system 4120 may be configured as a multi processor system, the control relating to each of the components of the electron optical system in the casing 4124 may be controlled by a main processor, and each of the control relating to the X-Y stage 4104, the conveyance robots 4134 and 4138, and the surface electrometer 4139 and the imaging process for generating a SEM image based on the signal detected by the secondary electron detector 4132 may be controlled by a sub processor.

An input/output device (user interface) 4141 is connected to the computer system 4120. The input/output device 4141 includes an input device for allowing a user to input an instruction or the like and a display device for displaying a GUI screen, a SEM image, and the like to input the instruction. The input device, for example, a mouse, a keyboard, or a voice input device only needs to allow the user to input data or an instruction. The display device is, for example, a display. This input/output device (user interface) may be a touch panel where data can be input and displayed.

When the length of a photoresist (hereinafter, also referred to as "resist") used in an ArF exposure technique or the like of semiconductor lithography is measured using a CD-SEM, it is known that the resist shrinks by electron beam irradiation. In order to reduce the amount of shrinkage and to measure the length of the fine resist pattern with high accuracy, it is desirable that the amount of an electron beam irradiating the resist is as small as possible. Therefore, repeated irradiation of the same region of the resist with an electron beam for length measurement needs to be avoided.

In the CD-SEM or the like, as a method of avoiding the same region of the resist from being irradiated with an electron beam multiple times, a method may be considered in which before actually executing a measurement recipe (a procedure given to the CD-SEM or the like, or a set of data or a program designating a processing method or a parameter), a region to be irradiated (scanned) with an electron beam based on the information such as the procedure of the measurement recipe or the parameter is divided in advance, and a measurement recipe for avoiding repeated irradiation (scanning) of the same region with an electron beam is generated.

When the execution of the measurement recipe starts in response to an instruction from the input/output device (user interface) 4141, the computer system 4120 of the device (CD-SEM) 4100 shown in FIG. 19 controls the X-Y stage 4104 based on the information such as the procedure designated by the measurement recipe, moves a sample 4105 to be measured to a predetermined position, and measures a target pattern. In general, a sliding mechanism is likely to be used in a stage adopted in a semiconductor inspection device or a semiconductor manufacturing device. It is known that, since the wear state of a sliding surface changes depending on driving conditions such as a speed, an acceleration, an interval, or a moving distance, sliding surface characteristics of the sliding mechanism changes over time. Accordingly, even when the X-Y stage 4104 executes initial adjustment of positioning in advance, depending on the change over time of the sliding surface characteristics (for example, a gap (tolerance) between components increases due to the wear of the sliding surface), there may be a problem in that, for example, the movement range (movable range) of the stage finely changes or the stop position accuracy (positioning accuracy) deteriorates. Therefore, in order to generate the measurement recipe for avoiding the repeated irradiation (scanning) of the same region with an electron beam, it is necessary to set a necessary control parameter and the like in consideration of the change over time in the stop position accuracy of the stage.

However, when a plurality of the same type of CD-SEMs are present, it is desirable that the same measurement recipe is used without a change in the same measurement inspection step. For example, when the same measurement recipe cannot be used and parameter setting and the like need to be executed for each of measurement recipes, the management of the measurement recipes becomes complicated in that, for example, a period of time is required for adjusting parameters for each device and the parameters cannot be shared.

However, in order to use the same measurement recipe for a plurality of devices, even when the small change in the movement range (movable range) of the stage or the variations of the stop position accuracy caused by the above-described change over time are different between the devices, the measurement recipe needs to operate for each of the devices without a problem. That is, in order to generate the common (the same) measurement recipe of the devices for avoiding the repeated irradiation (scanning) of the same region of the sample with an electron beam, parameters of the measurement recipe need to be set in consideration of the change over time of the stage that vary depending on the devices.

Figure 20:
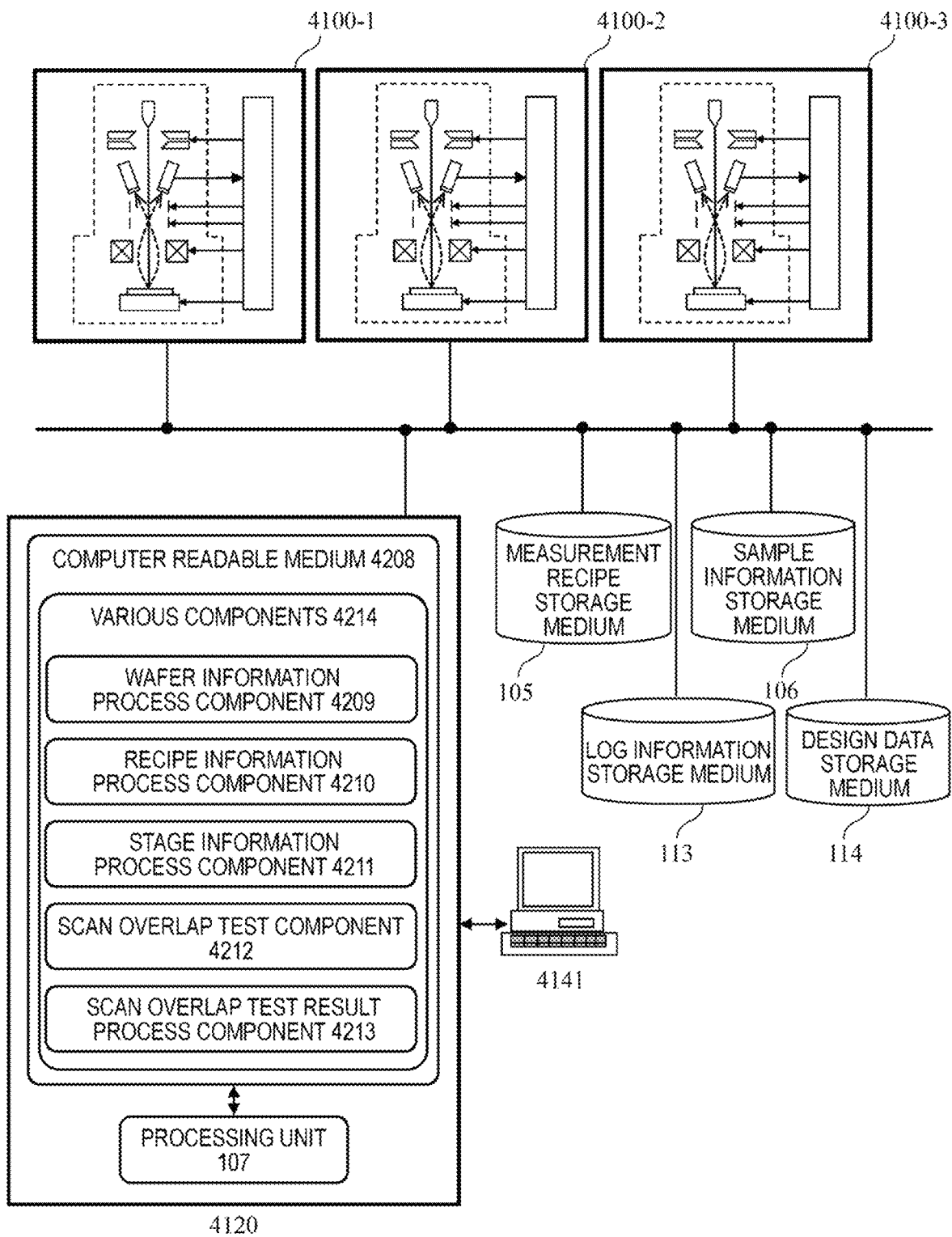
FIG. 20 is a diagram showing one example of a measurement system where three devices (CD-SEM) 4100 (4100-1, 4100-2, 4100-3) are connected to a computer system 4120 through a bus or a network.

FIG. 20 is a diagram showing one example of a measurement system where three devices (CD-SEM) 4100 (4100-1, 4100-2, 4100-3) are connected to the computer system 4120 through a bus or a network. The computer system 4120 can get access to, through a bus or a network, the measurement recipe storage medium 105 that stores a recipe as one operation program of the CD-SEM, the log information storage medium 113 that stores a current device state of the CD-SEM, the sample information storage medium 106 that stores sample information as a measurement target of the CD-SEM, and the design data storage medium 114 that stores design data of a semiconductor device. In addition, the input/output device 4141 that inputs and outputs data to and from the computer system 4120 is connected to the computer system 4120.

The computer system 4120 is configured with one or more computer sub systems. The computer system 4120 includes a computer readable medium 4208 and the processing unit 107 that executes each of components (modules) stored in the computer readable medium 4208. The computer readable medium 4208 stores various components 4214 that process information stored in a storage medium that is connected to be accessible to the computer system 103 described above or information instructed by a user through the input/output device (user interface) 4141. The various components 4214 include: a wafer information processing component 4209 that processes wafer information or in-chip information regarding a wafer to be processed in the device 4100; a recipe information processing component 4210 that processes the order of measurement or various alignment information or the like; a stage information processing component 4211 that processes log information where a stage movement position is recorded; a scan overlap test component 4212 that processes scan overlap test information; and a scan overlap test result processing component 4213 that processes information regarding a scan overlap test result. In addition, the description of the components common to those of FIG. 1 is the same as that of FIG. 1.

Figure 21:
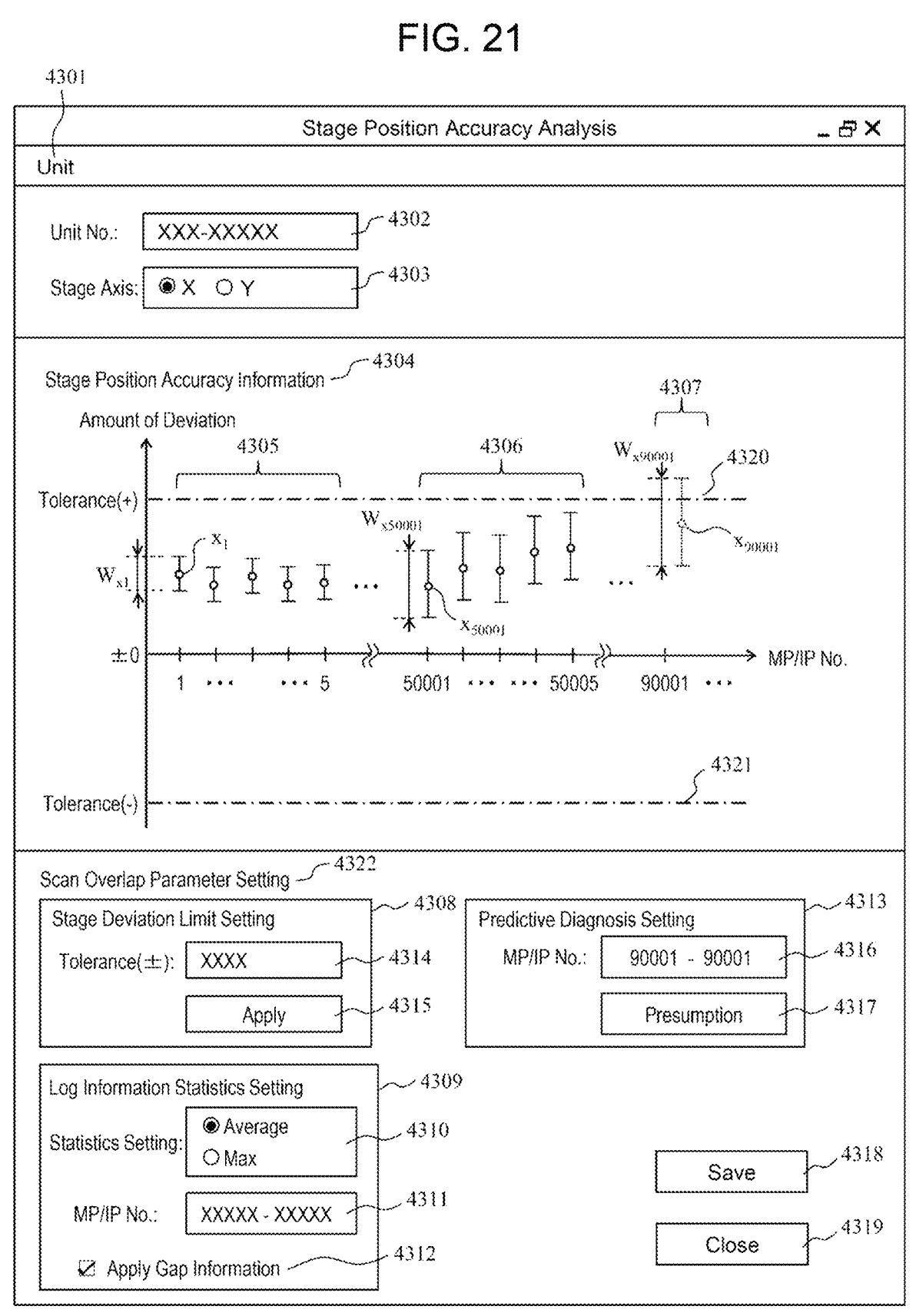

FIG. 21 is a diagram showing one example of an analysis screen that analyzes a stage position accuracy in each of the devices. Functions relating to the screen are processed by a stage information processing component 4211.

The user designates a target device that analyzes a stage position accuracy through a unit menu 4301. The stage information processing component 4211 reads tracking information (log information and movement history information) regarding stage movement of the designated target device from the storage unit or the storage device in the log information storage medium 113 or the computer system 4120, and causes a stage position accuracy information display unit 4304 to display the tracking information. In addition, the stage information processing component 4211 causes the stage position accuracy information display unit 4304 to display log information corresponding to a movement axis (X-axis or Y-axis) selected by a selection button 4303 of the stage axis.

The stage position accuracy information display unit 4304 displays tracking information regarding previous stage movement, in which the horizontal axis represents a measurement point/inspection point number (MP/IP No.) and the vertical axis represents the amount of deviation between a target position and a stop position regarding the stage movement. For example, the stage position accuracy information display unit 4304 of FIG. 43 displays tracking information 4305 of measurement point/inspection point numbers 1 to 5 and tracking information 4306 of measurement point/inspection point numbers 50001 to 50005. The tracking information of each of the measurement point/inspection points is displayed by the amount of deviation and the amount of gap. For example, the tracking information of the measurement point/inspection point 1 is displayed by the amount of deviation $x_1$ and the amount of gap $W_{x1}$, and the tracking information of the measurement point/inspection point 50001 is displayed by the amount of deviation $x_{50001}$ and the amount of gap $W_{x50001}$. Here, the amount of gap represents a variation width in the amount of deviation between a target position and a stop position regarding the stage movement. The amount of gap is a variation width in the amount of deviation that may be generated by a mechanical tolerance (gap) essential in a sliding mechanism configuring the stage, and can be calculated based on a detection signal from a position detector (for example, a laser displacement meter) that detects the position of the X-Y stage 4104 in real time and a measurement time. Alternatively, the amount of gap can be obtained by executing statistical processing (for example, using a standard error, a standard deviation, a confidence interval of an average value, or the like) for data regarding the detection signal and the measurement time from the position detector during multiple previous stage movements. In addition, when sliding surface characteristics of the sliding mechanism configuring the stage change over time, the amount of gap changes over time. In general, as the number of times of movement of the stage increases, the gap (tolerance) between components increases due to the wear of the sliding surface. Therefore, the amount of gap tends to increase as compared to the initial value.

When the user inputs a desired numerical value to a tolerance 4314 of a stage deviation limit setting unit 4308 and presses an Apply button, the stage information processing component 4211 displays widths (bars) 4320 and 4321 of tolerance based on the input numerical value. Here, the set tolerance value is used as a process parameter in a step of checking an overlap area in a scan overlap test execution flow of FIG. 24 described below.

In a scan overlap parameter setting unit 4322, the user executes parameter setting through a log information statistics setting unit 4309 and parameter setting through a predictive diagnosis setting unit 4413. Each of the parameters set in these setting units is used as a process parameter when a log information statistical processing 4415 or predictive diagnosis 4416 is selected in a stage position accuracy factor setting unit 4409 of a scan overlap test screen (FIG. 22) described below.

In the log information statistics setting unit 4309, the user designates a target range of the measurement point/inspection point where the statistical processing of the tracking information is executed through a measurement point/inspection point number setting unit 4311, and designates a method (average value or maximum value) of the statistical processing of the tracking information through a statistical processing setting unit 4310. In order to consider the amount of gap in the statistical processing, a gap information application check box 4312 is checked for designation.

In a predictive diagnosis setting unit 4313, the user executes parameter setting for presuming tracking information in the future measurement point/inspection point based on the previously acquired tracking information. When the user inputs a desired numerical value (number or range) to a measurement point/inspection point number setting unit 4316 and presses a Presumption button, the stage information processing component 4211 presumes the tracking information of the measurement point/inspection point in the target range based on the previously acquired tracking information, and causes the stage position accuracy information display unit 4304 to display the presumption result. In FIG. 21, for example, tracking information 4307 (the amount of deviation $X_{90001}$ and the amount of gap $Wx_{90001}$) presumed in a measurement point/inspection point number 90001 is displayed.

When the user determines various scan overlap parameters and subsequently presses a Save button 4318, the stage information processing component 4211 stores the various scan overlap parameters in the log information storage medium 113.

The user executes the operations and the settings described above for each of the movement axes (X-axis or Y-axis) of each of the devices through a stage position accuracy analysis screen of FIG. 21.

Figure 22:
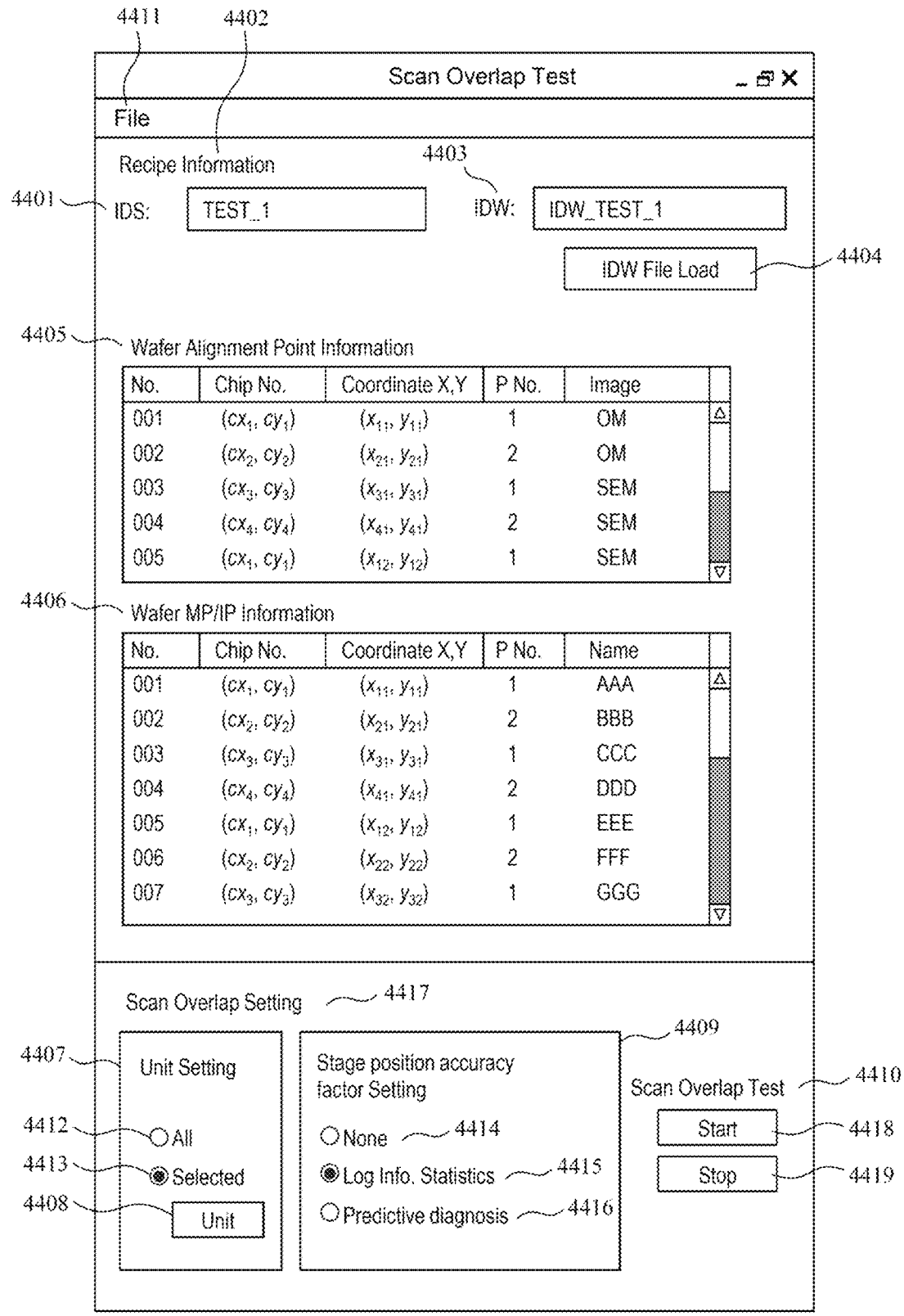
FIG. 22 is a diagram showing one example of a scan overlap test screen.

FIG. 22 is a diagram showing one example of a scan overlap test screen. Functions relating to the screen are processed by the scan overlap test component 4212.

The user designates an IDS file that describes the order of measurement or various alignment information through a File menu 4411. In addition, the user designates an IDW file that describes the wafer information or the in-chip information relating to a wafer through an IDW File Load button. The scan overlap test component 4212 reads the designated IDS file or IDW file from the storage unit or the storage device in the log information storage medium 113 or the computer system 4120 based on these designations, and causes a recipe information display unit 4402 to display the IDS file or the IDW file.

The IDS file or the IDW file is a file that is generated or edited using conditions or parameter settings desired by the user through another setting screen (not shown), and is stored in the storage unit or the storage device in the log information storage medium 113 or the computer system 4120. Functions relating to the generation or the edition of the IDS file or the IDW file are processed by the wafer information processing component 4209 or a recipe information processing component 4210.

On the scan overlap test screen, the scan overlap test component 4212 displays a name 4401 of the IDS file, a name 4403 of the IDW file, alignment point information 4405, and measurement point/inspection point information 4404. The alignment point information 4405 includes information of an alignment point for measurement (for example, an alignment chip, in-chip coordinates, an alignment condition, or an image for auto detection), and the measurement point/inspection point information 4404 includes information of a measurement point (for example, a length measurement chip, in-chip coordinates, or length measurement conditions).

In a scan overlap setting unit 4417, the user sets a device setting 4407 as a target of a scan overlap test and the stage position accuracy factor setting unit 4409.

In the device setting 4407, the user can select between "ALL" for designating all of the devices (the devices 4100-1 to 4100-3) connected to the system shown in FIG. 20 and "Selected" for designating a specific device. When "Selected" is selected, a target device is designated through the Unit button.

When the stage position accuracy factor (a condition or a setting parameter) determined from the stage position accuracy analysis screen of FIG. 43 is considered during the execution of the scan overlap test, the user selects the log information statistical processing 4415 or the predictive diagnosis 4416 in the stage position accuracy factor setting unit 4409. When the stage position accuracy factor is not considered, "None" 4414 is selected.

When a Start button 4418 is pressed after executing the above-described settings, the scan overlap test is executed.

Figure 23:
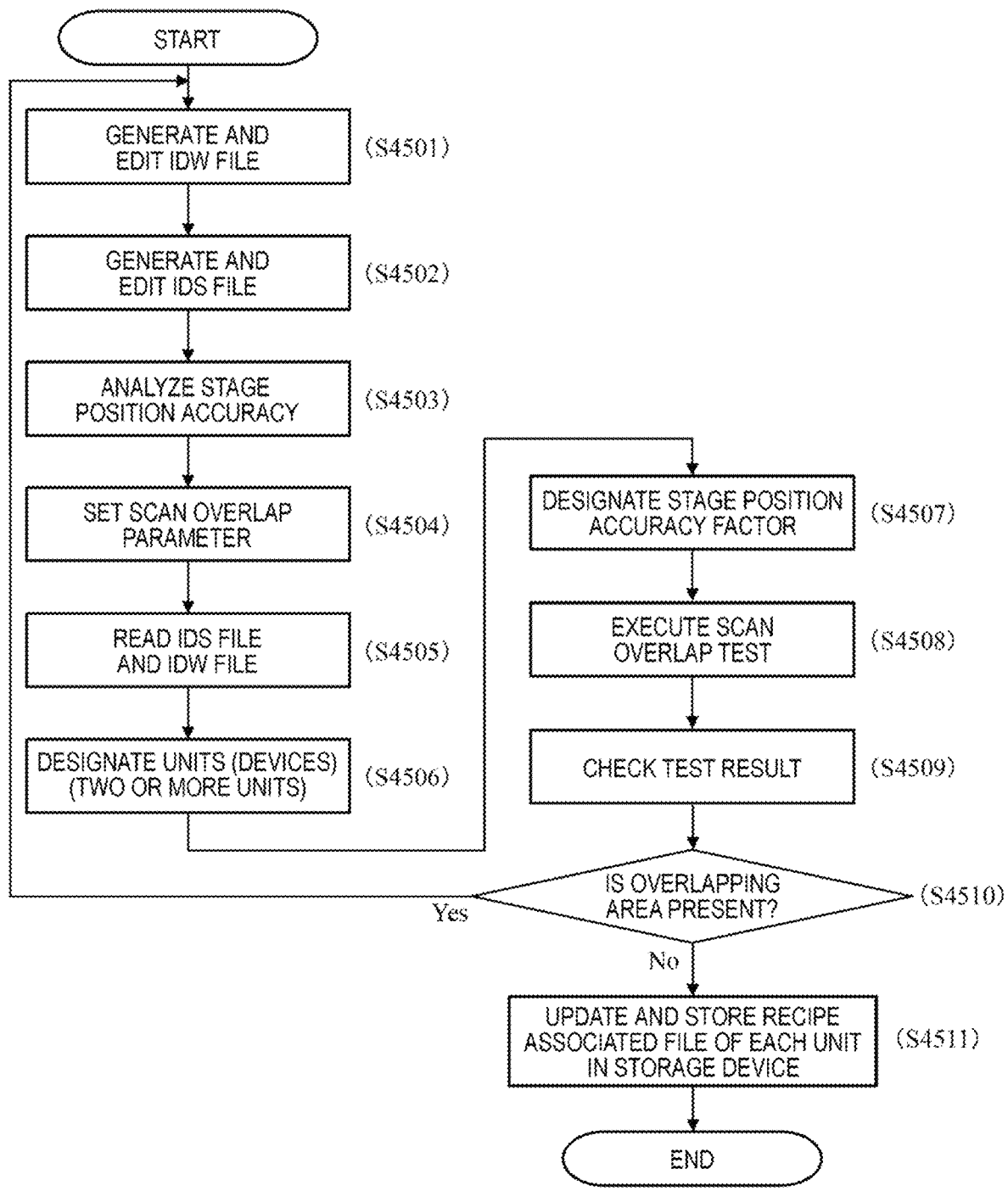
FIG. 23 is a flowchart showing a series of flows from the start to the end of the scan overlap test.

FIG. 23 is a flowchart showing a series of flows from the start to the end of the scan overlap test. The user generates and edits the IDW file or the IDS file (S4501 to S4502). The computer system 4120 analyzes the stage position accuracy of the device 4100 (S4503). The user sets the scan overlap parameters on the screen of FIG. 21 (S4504). The computer system 4120 reads the IDS file and the IDW file (S4505). In the Unit menu 4301, the user designates two or more devices for which overlapping of scan positions is tested (S4506). The user designates each of the parameters when overlapping of scan positions is tested (S4507). When the same recipe is used for the devices 4100 based on the setting, the computer system 4120 tests whether or not a portion where scan positions overlap each other is present in any of the devices 4100 (S4508). The computer system 4120 displays the test result, and the user checks the test result (S4509). When a portion where scan positions overlap each other (that is, unnecessary beam irradiation on the same position is repeated) is present, the computer system 4120 returns to S4501 and repeats the same process. When this portion is not present, the computer system 4120 updates the recipe and other associated parameters of each of the devices 4100 (S4511).

Figure 24:
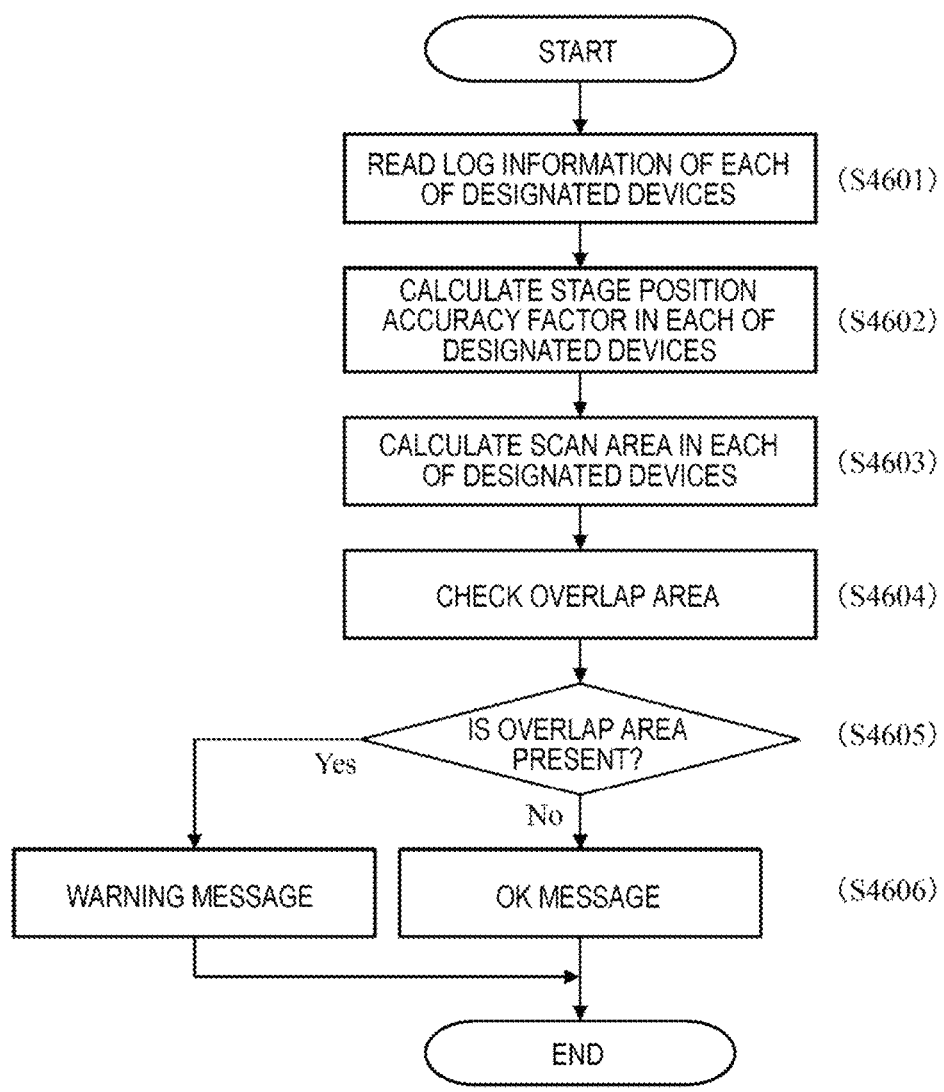
FIG. 24 is a flowchart showing a detailed step of S4508.

FIG. 24 is a flowchart showing a detailed step of S4508. The computer system 4120 reads log data of each of the designated devices 4100 (S4601). The computer system 4120 calculates stage position accuracy parameters in each of the designated devices 4100 (S4602). The computer system 4120 calculates a scan area in each of the designated devices 4100 (S4603). The computer system 4120 checks whether or not the portion where scan positions overlap each other is present in any of the devices 4100 (S4604). The computer system 4120 displays the check result on a screen of FIG. 25 described below (S4605 to S4606).

Figure 25:
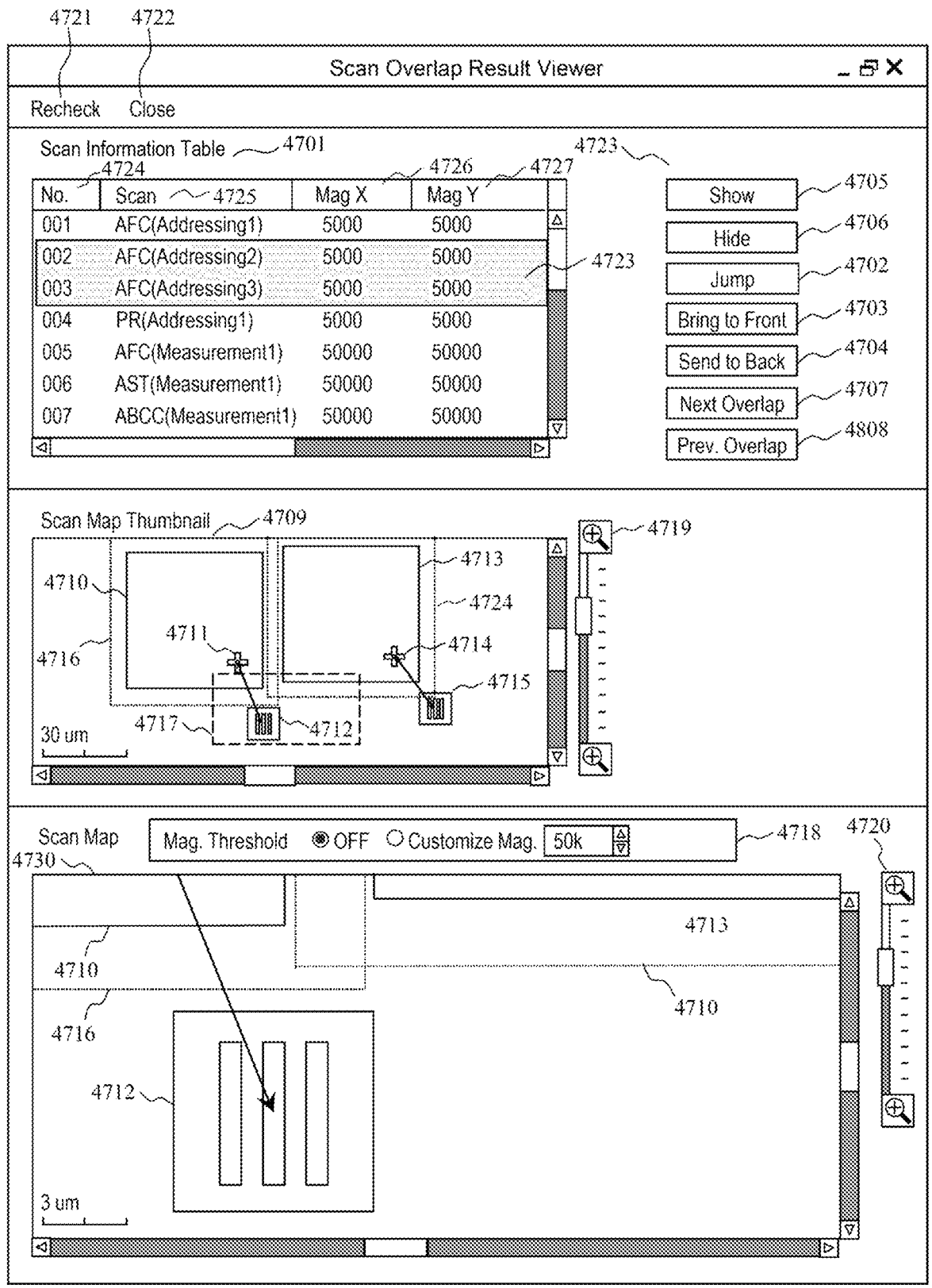
FIG. 25 is a diagram showing one example of a screen that displays an execution result of the scan overlap test.

FIG. 25 is a diagram showing one example of a screen that displays an execution result of the scan overlap test. Functions relating to the screen are processed by the scan overlap test result processing component 4213.

A scan information table 4701 displays the test result of each of the alignment point information 4405 or the measurement point/inspection point information 4404 line by line based on the setting information of the IDS file or the IDW file read from the scan overlap test screen.

When the user presses a Show button 4705 after clicking and designating a line for which the user wants to check the details of the test result from the scan information table 4701, a scan map thumbnail display unit 4709 displays the test detail result in a thumbnail view. In FIG. 47, in the scan information table 4701, the test results of two lines of No. 002 and No. 003 are designated, and the Show button 4705 is pressed. As a result, the test results (the test results of scan regions) at the two points are displayed. Further, in the scan map thumbnail display unit 4709, when the user designates an area 4717 that is desired to be enlarged and browsed from the input/output device, a scan map display unit 4730 enlarges and displays the details of the area 4717.

The scan map thumbnail display unit 4709 can zoom in and out the screen when a zoom bar 4719 is operated. In addition, a scan map display unit 4720 can zoom in and out the screen when the zoom bar 4719 is operated or the magnification is designated through a magnification setting unit 4718.

The user can execute various browsing operations for the test result through a browsing operation unit 4723. When the user presses a Hide button 4706 after clicking and designating a predetermined line of the test result from the scan information table 4701, the test result corresponding to the designated line is hidden from the scan map thumbnail display unit 4709 and the scan map display unit 4730. When a Jump button 4702 is pressed, an input screen of the number 4724 is activated (not shown), and the line of the test result corresponding to the input number can be designated. When a Bring to Front button 4703 is pressed, the front line of the scan information table 4701 is designated. When a Send to Back button 4704 is pressed, the final line of the scan information table 4701 is designated. When a Next Overlap button 4707 is pressed, the result of the next overlap area is designated and displayed in the scan information table 4701, the scan map thumbnail display unit 4709, and the scan map display unit 4730. When a Prev. Overlap button 4708 is pressed, the result of the previous overlap area is designated and displayed in the scan information table 4701, the scan map thumbnail display unit 4709, and the scan map display unit 4730.

Next, the content of the test result will be described. The scan information table 4701 displays a test result number 4724, scan information 4725 (detailed information of an alignment point or a measurement point/inspection point as a starting point of scanning), an X direction magnification 4726, and a Y direction magnification 4727. In the example of FIG. 25, the line of No. 002 corresponds to the test result of an alignment point (alignment pattern) 4711, and the line of No. 003 corresponds to the test result of an alignment point (alignment pattern) 4714. In addition, the test result of No. 002 is displayed as a scan area 4710 and a scan area 4716 on the scan map thumbnail display unit 4709, and the test result of No. 003 is displayed as a scan area 4713 and a scan area 4724 on the scan map thumbnail display unit 4709. In addition, length measurement points (length measurement patterns) 4712 and 4715 are addressed to the alignment points (alignment patterns) 4711 and 4714, and length measurement points (length measurement patterns) as a measurement target are displayed.

The scan areas 4710, 4713, 4716, and 4724 are calculated using the scan overlap parameters of each of the devices stored in the stage position accuracy analysis screen (FIG. 21). That is, the scan overlap test result processing component 4213 calculates the scan areas 4710, 4713, 4716, and 4724 based on various parameters (FIG. 21) of the scan overlap parameter setting unit 4322 and the scan overlap setting unit 4417 of the scan overlap test screen (FIG. 22) in each of the devices, and displays the calculation result on a scan overlap test execution result screen (FIG. 25).

The scan areas 4710 and 4713 indicated by a solid line represent the maximum scan area in an ideal case when the amount of deviation of the X-Y stage 4104 is not present (amount of deviation=0) in each of the devices, and the scan areas 4716 and 4724 indicated by a dotted line represent the maximum scan area when the amount of deviation of the X-Y stage 4104 is present (amount of deviation≠0) and changes over time in each of the devices. In the example of FIG. 25, in the ideal state where the amount of deviation is not present (amount of deviation=0), an overlap area is not present between the scan area 4710 of No. 002 and the scan area 4713 of No. 003. On the other hand, in the state where the amount of deviation is present and changes over time, an overlap area is present between the scan area 4716 of No. 002 and the scan area 4724 of No. 003. This represents that, when the same measurement recipe (the recipe configured with the IDS file and the IDW file) is used to execute the measurement in the same type of devices 4200-1 to 4200-3, an overlap area may be present during scanning in an actual state where the amount of deviation in each of the devices is present and changes over time.

When the user wants to change the scan overlap parameter setting, a target device for which the user wants to change the parameter setting is designated through a stage analysis menu 4722 of the scan overlap test execution result screen. Based on the designation, the stage position accuracy analysis screen (FIG. 21) is activated, and the desired parameter setting in the target device can be changed. Further, after changing the parameter setting, the scan overlap test can be executed again through a re-check menu 4721.

In the disclosure according to the embodiments, the system, the method, and the non-transitory computer readable medium storing the program are described, in which the system determines or adjusts a beam scanning region for inspection of an inspection recipe where a first inspection device and a second inspection device are used together based on first tracking information that records a movement locus of a first moving mechanism that moves a first sample when the first inspection device inspects a plurality of inspection points of the first sample by scanning the first sample with a first beam for inspection and second tracking information that records a movement locus of a second moving mechanism that moves a second sample when the second inspection device inspects a plurality of inspection points of the second sample by scanning the second sample with a second beam for inspection.

In the present disclosure according to the embodiments, the parameters of the measurement recipe can be set in consideration of the amount of deviation of the stage position accuracy that varies depending on the devices and the change over time thereof. Therefore, the common (the same) measurement recipe of the devices for avoiding the repeated irradiation (scanning) of the same region of the sample with an electron beam can be generated. That is, when a plurality of the same type of CD-SEMs are present, the same measurement recipe can be used without a change in the same measurement inspection step. In addition, when the generated same measurement recipe is used for a plurality of devices, even when the small change in the movement range (movable range) of the stage or the variations of the stop position accuracy caused by the above-described change over time are different between the devices, the effect of operating the measurement recipe for each of the devices without a problem is obtained.

Regarding Modification Example of Present Disclosure

The present disclosure is not limited to the embodiments described above and includes various modification examples. For example, the embodiments have been described in detail in order to easily describe the present invention, and the present invention is not necessarily to include all the configurations described above. In addition, a part of the configuration of one embodiment can be replaced with the configuration of another embodiment. Further, the configuration of one embodiment can be added to the configuration of another embodiment. In addition, addition, deletion, and replacement of another configuration can be made for a part of the configuration of each of the embodiments.

For example, each of the data described as the learning data in the first embodiment and each of the data described as the learning data in the second embodiment can be combined. Alternatively, the learning may be executed using only a part of each of the data described as the learning data in the first and second embodiments.

In the description of the second embodiment, four learning units are generated. Instead, only one learning device may be generated such that the data is clustered into four classifications corresponding to the first learning unit and the fourth learning unit in the single learning device.

REFERENCE SIGNS LIST

10: measurement system
100 to 102: CD-SEM
103: computer system
105: measurement recipe storage medium
106: sample information storage medium
113: log information storage medium
114: design data storage medium
1901: learning model
4100: device
4120: computer system

The invention claimed is:

1. A diagnosis system that diagnoses a state of a device for measuring or inspecting a sample, the diagnosis system comprising:
a computer system configured to estimate a cause for an error occurring in the device,
wherein the computer system includes a learning device configured to learn, by machine learning, a correspondence between at least one of a recipe that defines an operation of the device, log data that describes the state of the device, or sample data that describes characteristics of the sample and a type of the error, and
when the error occurs in the device after the learning device executes the machine learning, the computer system inputs at least one of the recipe used by the device when the error occurs, the log data when the error occurs, or the sample data when the error occurs to the learning device, so as to acquire an estimation result for at least one cause of the recipe, the state of the device, or the characteristics of the sample among the causes for the error as an output of the learning device and to output the estimation result,
wherein the device is configured to acquire an image of the sample,
the learning device learns, as the recipe, at least one of the number of inspection points on the sample, a coordinate of the inspection point on the sample, an image of the sample that is acquired in advance before the device inspects the sample, an inspection condition by the device, or an inspection sequence by the device,
the learning device learns, as the state of the device, at least one of a coordinate of an addressing pattern as a reference for specifying the inspection point, a duration of auto focus, a gain value and a bias value when auto brightness contrast control is executed, a shape and a size of a pattern formed on the sample, an output value of a sensor in the device, a voltage value and a current value to be supplied to a component in the device, or a control signal for a DA converter, and
the learning device learns, as a characteristic of the sample, at least one of a manufacturing condition of the sample, a type of an exposure device used for patterning a resist pattern for forming a pattern on the sample, an exposure condition of the exposure device, a material of the resist pattern, a thickness of the resist pattern, or a shape and a size of the resist pattern.

2. A diagnosis system that diagnoses a state of a device for measuring or inspecting a sample, the diagnosis system comprising:
a computer system configured to estimate a cause for an error occurring in the device,
wherein the computer system includes a learning device configured to learn, by machine learning, a correspondence between at least one of a recipe that defines an operation of the device, log data that describes the state of the device, or sample data that describes characteristics of the sample and a type of the error,
when the error occurs in the device after the learning device executes the machine learning, the computer system inputs at least one of the recipe used by the device when the error occurs, the log data when the error occurs, or the sample data when the error occurs to the learning device, so as to acquire an estimation result for at least one cause of the recipe, the state of the device, or the characteristics of the sample among the causes for the error as an output of the learning device and to output the estimation result,
wherein the learning device further learns a correspondence between at least one of an amount of variation in a recipe that defines an operation of the device, an amount of variation in log data that describes the state of the device, or an amount of variation in sample data that describes characteristics of the sample and an amount of variation in an inspection accuracy of the device, and
the computer system inputs at least one of a new recipe, new log data, or new sample data to the learning device, so as to acquire an estimation result for the amount of variation in the inspection accuracy of the device as an output of the learning device and to output the estimation result.

3. A diagnosis system that diagnoses a state of a device for measuring or inspecting a sample, the diagnosis system comprising:
a computer system configured to estimate a cause for an error occurring in the device,
wherein the computer system includes a learning device configured to learn, by machine learning, a correspondence between at least one of a recipe that defines an operation of the device, log data that describes the state of the device, or sample data that describes characteristics of the sample and a type of the error,
when the error occurs in the device after the learning device executes the machine learning, the computer system inputs at least one of the recipe used by the device when the error occurs, the log data when the error occurs, or the sample data when the error occurs to the learning device, so as to acquire an estimation result for at least one cause of the recipe, the state of the device, or the characteristics of the sample among the causes for the error as an output of the learning device and to output the estimation result, wherein the learning device further learns that the error does not occur in association with at least one of the recipe, the log data, or the sample data obtained when the error does not occur, the learning device further learns an event probability of the error in association with the type of the error, the learning device further learns that the error does not occur in association with a non-event probability of the error, after the learning device executes the machine learning, the computer system inputs at least one of the recipe, the log data, or the sample data to the learning device, so as to acquire the event probability and the non-event probability as an output of the learning device, and the computer system diagnoses a degree of prediction to which the error occurs based on the event probability and the non-event probability and outputs the diagnosis result.

4. A diagnosis system that diagnoses a state of a device for measuring or inspecting a sample, the diagnosis system comprising:

a computer system configured to estimate a cause for an error occurring in the device, wherein the computer system includes a learning device configured to learn, by machine learning, a correspondence between at least one of a recipe that defines an operation of the device, log data that describes the state of the device, or sample data that describes characteristics of the sample and a type of the error, when the error occurs in the device after the learning device executes the machine learning, the computer system inputs at least one of the recipe used by the device when the error occurs, the log data when the error occurs, or the sample data when the error occurs to the learning device, so as to acquire an estimation result for at least one cause of the recipe, the state of the device, or the characteristics of the sample among the causes for the error as an output of the learning device and to output the estimation result, wherein when the estimation result of the cause for the error is a known cause, the computer system corrects at least one of the recipe or the state of the device and acquires a reinspection result from the device, and when the reinspection result is normal, the computer system relearns that the error does not occur in association with at least one of the recipe used by the device when the reinspection result is acquired, the log data when the reinspection result is acquired, or the sample data when the reinspection result is acquired.

5. The diagnosis system according to claim 4, wherein when the reinspection result is the error and the estimation result of the cause for the error is not a known cause, the computer system executes an error recovery process and acquires the reinspection result again from the device, and when the reinspection result that is acquired again is normal, the computer system causes the learning device to execute the relearning.

6. The diagnosis system according to claim 3, further comprising:

a storage unit configured to store at least one of a change over time in the recipe, a change over time in the log data, or a change over time in the sample data, wherein the learning device learns a correspondence between at least one of a portion of the change over time in the recipe where an amount of charge over time is more than or equal to a threshold, a portion of the change over time in the log data where an amount of charge over time is more than or equal to a threshold, or a portion of the change over time in the sample data where an amount of charge over time is more than or equal to a threshold and at least one of the event probability or the non-event probability, and the computer system inputs at least one of a change over time in the recipe, a change over time in the log data, or a change over time in the sample data to the learning device, so as to acquire the event probability and the non-event probability as an output of the learning device.

7. A diagnosis system that diagnoses a state of a device for measuring or inspecting a sample, the diagnosis system comprising:

a computer system configured to estimate a cause for an error occurring in the device, wherein the computer system includes a learning device configured to learn, by machine learning, a correspondence between at least one of a recipe that defines an operation of the device, log data that describes the state of the device, or sample data that describes characteristics of the sample and a type of the error, when the error occurs in the device after the learning device executes the machine learning, the computer system inputs at least one of the recipe used by the device when the error occurs, the log data when the error occurs, or the sample data when the error occurs to the learning device, so as to acquire an estimation result for at least one cause of the recipe, the state of the device, or the characteristics of the sample among the causes for the error as an output of the learning device and to output the estimation result, wherein the learning device includes a first learning unit configured to learn a correspondence between the recipe and the type of the error, a second learning unit configured to learn a correspondence between the log data and the type of the error, a third learning unit configured to learn a correspondence between the sample data and the type of the error, and a fourth learning unit configured to learn a correspondence between an estimation result by the first learning unit, an estimation result by the second learning unit, an estimation result by the third learning unit, and the type of the error, wherein the learning device outputs the estimation result by each of the first learning unit, the second learning unit, the third learning unit, and the fourth learning unit as an output of the learning device.

8. A diagnosis system that diagnoses a state of a device for measuring or inspecting a sample, the diagnosis system comprising:

a computer system configured to estimate a cause for an error occurring in the device, wherein the computer system includes a learning device configured to cluster, by machine learning, a combination of one or more of process content data that describes a content of an inspection process to be executed by the device, an inspection condition by the device, and attribute data that describes an attribute of the device, when the error occurs in the device after the learning device executes the machine learning, the computer system inputs a first combination of one or more of the process content data that describes the content of the inspection process to be executed by the device when the error occurs, the inspection condition when the error occurs, and the attribute data to the learning device, so as to classify the first combination into one of clusters obtained by the clustering, and the computer system acquires an estimation result on whether or not the error occurs based on a result of the classification and outputs the estimation result, wherein the device is configured to acquire an image of the sample, the computer system causes the learning device to learn the first combination when the error does not occur, the first combination is clustered into one of the classifications, and the image is normal, so as to generate a first learning unit configured to cluster the first combination when the error does not occur, all of the content of the inspection process, the inspection condition, and the attribute are normal, and the image is normal, and when a new first combination is used, based on whether or not the new first combination is classified into one of clustering results by the first learning unit, the computer system acquires, from the first learning unit, an estimation result on whether or not the error does not occur, all of the content of the inspection process, the inspection condition, and the attribute are normal, and the image is normal.

9. A diagnosis system that diagnoses a state of a device for measuring or inspecting a sample, the diagnosis system comprising:

a computer system configured to estimate a cause for an error occurring in the device, wherein the computer system includes a learning device configured to cluster, by machine learning, a combination of one or more of process content data that describes a content of an inspection process to be executed by the device, an inspection condition by the device, and attribute data that describes an attribute of the device, when the error occurs in the device after the learning device executes the machine learning, the computer system inputs a first combination of one or more of the process content data that describes the content of the inspection process to be executed by the device when the error occurs, the inspection condition when the error occurs, and the attribute data to the learning device, so as to classify the first combination into one of clusters obtained by the clustering, and the computer system acquires an estimation result on whether or not the error occurs based on a result of the classification and outputs the estimation result, wherein the device is configured to acquire an image of the sample, the computer system causes the learning device to learn the first combination when the error does not occur, the first combination is clustered into one of the classifications, and the image is abnormal, so as to generate a third learning unit configured to cluster the first combination when the error does not occur, all of the content of the inspection process, the inspection condition, and the attribute are normal, and the image is abnormal, and when a new first combination is used, based on whether or not the new first combination is classified into one of clustering results by the third learning unit, the computer system acquires, from the third learning unit, an estimation result on whether or not the error does not occur, all of the content of the inspection process, the inspection condition, and the attribute are normal, and the image is abnormal.

10. A diagnosis system that diagnoses a state of a device for measuring or inspecting a sample, the diagnosis system comprising:

a computer system configured to estimate a cause for an error occurring in the device, wherein the computer system includes a learning device configured to cluster, by machine learning, a combination of one or more of process content data that describes a content of an inspection process to be executed by the device, an inspection condition by the device, and attribute data that describes an attribute of the device, when the error occurs in the device after the learning device executes the machine learning, the computer system inputs a first combination of one or more of the process content data that describes the content of the inspection process to be executed by the device when the error occurs, the inspection condition when the error occurs, and the attribute data to the learning device, so as to classify the first combination into one of clusters obtained by the clustering, and the computer system acquires an estimation result on whether or not the error occurs based on a result of the classification and outputs the estimation result, the computer system causes the learning device to learn the first combination when the error does not occur, the first combination is not clustered into one of the classifications, and the error is avoided through the recovery process, so as to generate a second learning unit configured to cluster the first combination when the error does not occur, at least one of the content of the inspection process, the inspection condition, or the attribute is abnormal, and the content of the inspection process, the inspection condition, and the attribute used in the recovery process are normal, and when a new first combination is used, based on whether or not the new first combination is classified into one of clustering results by the second learning unit, the computer system acquires, from the second learning unit, an estimation result on whether or not the error does not occur, at least one of the content of the inspection process, the inspection condition, or the attribute is abnormal, and the content of the inspection process, the inspection condition, and the attribute used in the recovery process are normal.

11. A diagnosis system that diagnoses a state of a device for measuring or inspecting a sample, the diagnosis system comprising:

a computer system configured to estimate a cause for an error occurring in the device, wherein the computer system includes a learning device configured to cluster, by machine learning, a combination of one or more of process content data that describes a content of an inspection process to be executed by the device, an inspection condition by the device, and attribute data that describes an attribute of the device, when the error occurs in the device after the learning device executes the machine learning, the computer system inputs a first combination of one or more of the process content data that describes the content of the inspection process to be executed by the device when the error occurs, the inspection condition when the error occurs, and the attribute data to the learning device, so as to classify the first combination into one of clusters obtained by the clustering, and the computer system acquires an estimation result on whether or not the error occurs based on a result of the classification and outputs the estimation result, wherein when the error does not occur and the first combination is not clustered into one of the classifications, the computer system causes the device to execute a recovery process that is defined in advance to avoid the error, the computer system causes the learning device to learn the first combination when the error does not occur, the first combination is not clustered into one of the classifications, and the error is not avoided through the recovery process, so as to generate a fourth learning unit configured to cluster the first combination when the error does not occur, at least one of the content of the inspection process, the inspection condition, or the attribute is abnormal, and at least one of the content of the inspection process, the inspection condition, or the attribute used in the recovery process is abnormal, and when a new first combination is used, based on whether or not the new first combination is classified into one of clustering results by the fourth learning unit, the computer system acquires, from the fourth learning unit, an estimation result on whether or not the error does not occur, at least one of the content of the inspection process, the inspection condition, or the attribute is abnormal, and at least one of the content of the inspection process, the inspection condition, or the attribute used in the recovery process is abnormal.

12. A diagnosis system that diagnoses a state of a device for measuring or inspecting a sample, the diagnosis system comprising:

a computer system configured to estimate a cause for an error occurring in the device, wherein the computer system includes a learning device configured to cluster, by machine learning, a combination of one or more of process content data that describes a content of an inspection process to be executed by the device, an inspection condition by the device, and attribute data that describes an attribute of the device, when the error occurs in the device after the learning device executes the machine learning, the computer system inputs a first combination of one or more of the process content data that describes the content of the inspection process to be executed by the device when the error occurs, the inspection condition when the error occurs, and the attribute data to the learning device, so as to classify the first combination into one of clusters obtained by the clustering, and the computer system acquires an estimation result on whether or not the error occurs based on a result of the classification and outputs the estimation result, wherein the device is configured to acquire an image of the sample, the learning device learns, as the content of the inspection process, at least one of alignment of aligning a coordinate system of a stage on which the sample is placed and a coordinate system of the device, addressing of moving an inspection position to an inspection point on the sample, adjustment of an auto focus mechanism, auto astigmatism, or auto brightness contrast control, the learning device learns, as the inspection condition, at least one of a field of view size acquired during the addressing, the number of images acquired during the adjustment of the auto focus mechanism, a cumulative number of frames of the image, a distance between a shape pattern and an inspection point on the sample used during the adjustment of the auto focus mechanism, a relative direction between a shape pattern and an inspection point on the sample used during the adjustment of the auto focus mechanism, or a lens condition, and the learning device learns, as the attribute of the device, at least one of an identifier of the device or a characteristic of an environment where the device is provided.

13. A diagnosis system that irradiates a sample with a charged particle beam to diagnose a charged particle beam device, the diagnosis system comprising:

a computer system configured to diagnose whether or not the same position of the sample is repeatedly irradiated with the charged particle beam, wherein the computer system determines a beam scanning region for inspection of an inspection recipe where a first charged particle beam device and a second charged particle beam device are used based on first tracking information that records a movement locus of a first moving mechanism that moves a first sample when the first charged particle beam device inspects a plurality of inspection points of the first sample by scanning the first sample with a first charged particle beam and second tracking information that records a movement locus of a second moving mechanism that moves a second sample when the second charged particle beam device inspects a plurality of inspection points of the second sample by scanning the second sample with a second charged particle beam.

14. The diagnosis system according to claim 13, wherein the computer system acquires tracking data that describes a variation width of a positioning accuracy of a stage on which the sample is placed from each of a plurality of the same type of charged particle beam devices, when each of the charged particle beam devices executes the same operation, the computer system determines whether or not the same position on the sample is irradiated with the charged particle beam repeatedly an allowable number of times based on the variation width described in the tracking data acquired from each of the charged particle beam devices, and the computer system outputs a result of the determination.

15. The diagnosis system according to claim 13, wherein the first tracking information describes a history of a position variation width when the first moving mechanism positions the first sample, the second tracking information describes a history of a position variation width when the second moving mechanism positions the second sample, the computer system calculates, as a first variation width, a maximum variation width of the positioning by the first moving mechanism based on the history of the position variation width described in the first tracking information, the computer system calculates, as a second variation width, a maximum variation width of the positioning by the second moving mechanism based on the history of the position variation width described in the second tracking information, and when the first charged particle beam device and the second charged particle beam device execute the same operation, the computer system determines whether or not the same position on the sample is irradiated with the charged particle beam repeatedly an allowable number of times based on whether or not the first variation width and the second variation width overlap each other on the sample.

16. The diagnosis system according to claim 13, wherein the first tracking information describes a change over time in the movement locus of the first moving mechanism, the second tracking information describes a change over time in the movement locus of the second moving mechanism, the computer system estimates a change in the movement locus of the first moving mechanism based on the change over time in the movement locus of the first moving mechanism that describes the first tracking information, the computer system estimates a change in the movement locus of the second moving mechanism based on the change over time in the movement locus of the second moving mechanism that describes the second tracking information, and when the first charged particle beam device and the second charged particle beam device execute the same operation, the computer system determines whether or not the same position on the sample is irradiated with the charged particle beam repeatedly an allowable number of times based on whether or not the estimated change in the movement locus of the first moving mechanism and the estimated change in the movement locus of the second moving mechanism overlap each other on the sample.

\* \* \* \* \*